United States Patent
Lee et al.

(10) Patent No.: US 6,815,331 B2
(45) Date of Patent: Nov. 9, 2004

(54) METHOD FOR FORMING METAL WIRING LAYER OF SEMICONDUCTOR DEVICE

(75) Inventors: Kyoung-woo Lee, Seoul (KR); Hong-jae Shin, Seoul (KR); Jae-hak Kim, Seoul (KR); Soo-geun Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 10/392,710

(22) Filed: Mar. 20, 2003

(65) Prior Publication Data

US 2003/0176056 A1 Sep. 18, 2003

Related U.S. Application Data

(63) Continuation-in-part of application No. 10/114,274, filed on Apr. 2, 2002.

(51) Int. Cl.[7] .......................................... H01L 21/4163
(52) U.S. Cl. ....................... 438/622; 438/623; 438/624; 438/637
(58) Field of Search ................................. 438/622, 623, 438/624, 631, 634, 637

(56) References Cited

U.S. PATENT DOCUMENTS

| | | | | |
|---|---|---|---|---|
| 6,025,259 A | * | 2/2000 | Yu et al. ...................... | 438/618 |
| 6,037,255 A | * | 3/2000 | Hussein et al. .............. | 438/675 |
| 6,323,123 B1 | * | 11/2001 | Liu et al. ..................... | 438/638 |
| 6,448,177 B1 | * | 9/2002 | Morrow et al. .............. | 438/638 |
| 6,465,358 B1 | * | 10/2002 | Nashner et al. ............. | 438/700 |
| 6,627,540 B2 | * | 9/2003 | Lee .............................. | 438/638 |
| 2002/0081834 A1 | * | 6/2002 | Daniels et al. .............. | 438/624 |
| 2003/0001273 A1 | * | 1/2003 | Steiner et al. .............. | 257/760 |

* cited by examiner

Primary Examiner—T. N. Quach
(74) Attorney, Agent, or Firm—F. Chau & Associates LLC

(57) ABSTRACT

Methods for forming a metal wiring layer in a semiconductor device using a dual damascene process. In one aspect, a method for forming metal wiring in a semiconductor device comprises: forming a stopper layer on a semiconductor substrate that has a conductive layer formed thereon; forming an interlayer dielectric layer on the stopper layer; forming a hard mask layer on the interlayer dielectric layer; forming a first photoresist pattern on the hard mask layer, the first photoresist pattern having a first opening corresponding to the conductive layer; etching the hard mask layer and the interlayer dielectric layer using the first photoresist pattern as an etching mask to form a via hole in the interlayer dielectric layer through which a portion of the stopper layer is exposed; removing the first photoresist pattern; filling the via hole with an intermediary material layer; etching a portion of the hard mask layer to form a hard mask pattern that defines a wiring region, wherein the hard mask pattern comprises a second opening that overlaps the entire via hole or at least a portion of the via hole; removing the intermediary material layer from the via hole; forming the wiring region by etching a portion of the interlayer dielectric layer using the hard mask pattern as an etching mask; removing a portion of the stopper layer exposed by the via hole; and filling the via hole and the wiring region with a conductive material.

17 Claims, 28 Drawing Sheets

METHOD FOR FORMING METAL WIRING LAYER OF SEMICONDUCTOR DEVICE

CROSS-REFERENCE TO RELATED APPLICATIONS

This application is a continuation-in-part of U.S. patent application Ser. No. 10/114,274, filed on Apr. 2, 2002, which claims priority to Korean Patent Application No. 2001-26966 filed on May 17, 2001, and which is incorporated herein by reference. This application further claims priority to Korean Patent Application No. 02-27442 filed on May 17, 2002.

BACKGROUND

1. Technical Field

The present invention relates to methods for fabricating a semiconductor device, and, more particularly, to methods for forming a metal wiring layer in a semiconductor device through a dual damascene process.

2. Description of Related Art

As the integration density of semiconductor devices increases, a gap width between metal wiring layers in the semiconductor devices decreases. Consequently, it has been necessary to design metal wiring layers having a multi-layered wiring structure. However, parasitic resistance and capacitance existing between adjacent metal wiring layers in a lateral direction or in a vertical direction may affect the performance of the semiconductor devices.

Such parasitic resistance and capacitance components in a metal wiring layer generally cause a decrease in the operating speed, and thus deteriorate the electrical characteristics of the device. Further, the parasitic resistance and capacitance components increase the total power consumption of chips in the semiconductor device and an amount of signal leakage. Accordingly, a need exists to develop a method for forming a multi-layered wiring layer having low parasitic resistance and capacitance in a super-highly integrated semiconductor device.

Typically, a multi-layered wiring structure that has low parasitic resistance and capacitance is formed of a metal having low specific resistance or a dielectric layer having a low dielectric constant. For instance, a metal wiring layer that is formed of a material having low specific resistance such as copper has been studied. It is difficult to form a copper wiring layer by patterning copper using photolithography. Thus, a dual damascene process is commonly used to form such a copper wiring layer.

FIGS. 1 through 5 are cross-sectional views of a metal wiring layer in a semiconductor device formed according to a conventional method. Referring to FIG. 1, a stopper layer 104 is formed on a semiconductor substrate 100, on which a predetermined conductive layer 102 has been formed. An interlayer insulating layer 106 is formed on the stopper layer 104. Next, a first photoresist pattern 108 is formed on the interlayer insulating layer 106. The first photoresist pattern 108 comprises a first opening $H_1$ having a first width $W_1$ and partially exposing the surface of the interlayer insulating layer 106. In other words, the interlayer insulating layer 106 is covered with photoresist, and then the photoresist is exposed to light and developed, thereby forming the first photoresist pattern 108.

Referring to FIG. 2, the interlayer insulating layer 106 is etched using the first photoresist pattern 108 as an etching mask until the top surface of the stopper layer 104 is exposed. Thus, a via hole 110 having the first width $W_1$ is formed in an interlayer insulating layer 106a. The first photoresist pattern 108 is removed by a conventional method such as an ashing process.

Referring to FIG. 3, a second photoresist pattern 112 is formed on the interlayer insulating layer 106a having the via hole 110. The second photoresist pattern 112 comprises a second opening $H_2$ having a second width $W_2$ greater than the first width $W_1$ and partially exposing the surface of the interlayer insulating layer 106a. The second opening $H_2$ is aligned with the via hole 110.

Referring to FIG. 4, the interlayer insulating layer 106a is etched using the second photoresist pattern 112 as an etching mask by a dry etching method. As a result, a wiring region 114 having the second width $W_2$ is formed in an interlayer insulating layer 106b, and a via hole 110a having the first width $W_1$ is formed at the lower part of the wiring region 114 to connect the conductive layer 102 to the wiring region 114. However, during the etching process of the interlayer insulating layer 106a, the stopper layer 104 may be etched with the interlayer insulating layer 106a, thereby exposing the conductive layer 102.

Even though the interlayer insulating layer 106b has a high etching selectivity to a stopper layer 104a, the stopper layer 104 exposed through the via hole 110 (See FIG. 3) is inevitably etched at a predetermined speed during the etching of the interlayer insulating layer 106a. Accordingly, after etching of the interlayer insulating layer 106b is completed, the exposed stopper layer 104 may be completely etched, and thus the conductive layer may be exposed to an etching atmosphere. If the conductive layer 102, for example, a copper wiring layer, is exposed to an etching atmosphere, hard polymer (not shown) is formed along sidewalls of the interlayer insulating layer 106b. Such hard polymer is difficult to remove. The hard polymer is more easily formed for a case where the interlayer insulating layer 106a to be etched is deeper, the stopper layer 104a is thinner, and the etching selectivity of the stopper layer 104a with respect to the interlayer insulating layer 106b is smaller.

Referring to FIG. 5, the second photoresist pattern 112 is removed by an ashing process. The ashing process uses an oxygen-based plasma. During the removal of the second photoresist pattern 112, that is, during the ashing process, the exposed conductive layer 102 may react with oxygen and form a metal oxide layer 116. The metal oxide layer 116 rapidly increases electrical resistance. Thus, even though the wiring region 114 and the via hole 110a are filled with a conductive material, a metal wiring layer (not shown) and the conductive layer 102 cannot be electrically connected to each other, thus causing a lifting phenomenon. Further, since the ashing process using an oxygen-based plasma is performed after forming the wiring region 114 and the via hole 110a, the process may damage to the surface of the interlayer insulating layer 106b. For instance, $H_2O$, OH, $CO_2$, and $H_2$ released during the ashing process stick to the surface of the interlayer insulating layer 106b, and thus the dielectric constant of the interlayer insulating layer 106b may be rapidly increased.

FIGS. 6 through 10 are cross-sectional views of another metal wiring layer in a semiconductor device formed according to another conventional method. Referring to FIG. 6, a stopper layer 204 is formed on a semiconductor substrate, on which a conductive layer 202 has been formed. An interlayer insulating layer 206 is formed on the stopper layer 204. Next, a first photoresist pattern 208, which includes a first opening $H_1$ having a first width $W_1$ and partially exposing the surface of the interlayer insulating layer 206, is formed on the interlayer insulating layer 206. In other words, the interlayer insulating layer 206 is covered with photoresist, and then the photoresist is exposed to light and developed, thereby forming the first photoresist pattern 208.

Referring to FIG. 7, the interlayer insulating layer 206 is partially etched using the first photoresist pattern 208 as an etching mask so that a partial via hole 210 having the first width $W_1$ is formed in an interlayer insulating layer 206a. The first photoresist pattern 208 is removed by a typical method such as an ashing process.

Referring to FIG. 8A, a second photoresist pattern 212 is formed on the interlayer insulating layer 206a having the partial via hole 210. The second photoresist pattern 212 comprises a second opening $H_2$ having a second width $W_2$ greater than the first width $W_1$ and partially exposing the surface of the interlayer insulating layer 206a. The second opening $H_2$ is formed to be aligned with the partial via hole 210. However, photoresist from the second photoresist pattern 212 may remain on the bottom surface of the partial via hole 210 during the forming of the second photoresist pattern 212 on the interlayer insulating layer 206a. Since the remaining photoresist will act as a barrier to a subsequent etching process of the interlayer insulating layer 206a, an unopened via hole may be formed after etching the interlayer insulating layer 206a.

FIG. 8B illustrates an exemplary mis-aligned second photoresist pattern 212a. In this case, photoresist may also remain on the bottom surface of the partial via hole 210 as shown in FIG. 8A.

Referring to FIG. 9a, the interlayer insulating layer 206a is etched using the second photoresist pattern 212 as an etching mask by a dry etching method. As a result, a wiring region 214 having the second width $W_2$ is formed in the interlayer insulating layer 206b, and a via hole 210a having the first width $W_1$ is formed under the wiring region 214 so as to connect the conductive layer 202 to the wiring region 214. However, the photoresist remaining on the bottom surface of the partial via hole 210 of FIG. 8A acts as a barrier to the etching process of the interlayer insulating layer 206a. Thus, the interlayer insulating layer 206b positioned under the partial via hole 210 of FIG. 8A cannot be etched, and thus the via hole 210a may not expose the conductive layer 202.

FIG. 9B illustrates the semiconductor substrate 200 on which the mis-aligned second photoresist pattern 212a is formed. The wiring region 214 and the via hole 210a are formed by etching the interlayer insulating layer 206a using the mis-aligned second photoresist pattern 212a as an etching mask. As shown in FIG. 9B, if a second photoresist pattern is mis-aligned, the width of the via hole 210a is less than the first width $W_1$, and the profile of the via hole 210a is deteriorated. As described above with reference to FIG. 9A, if photoresist from the mis-aligned second photoresist pattern 212a remains on the bottom surface of the partial via hole 210 (as shown in FIG. 8B), a via hole (not shown) that does not expose the conductive layer 202 may be formed.

FIG. 10A is illustrates an exemplary metal wiring layer having an unopened via hole. Referring to FIGS. 9A and 10A, the second photoresist pattern 212 is removed by an ashing process. At this time, the photoresist remaining on the bottom surface of the via hole 210a of FIG. 9A is also removed. However, as described above, since the via hole 210 does not expose the conductive layer 202 because of the photoresist remaining on the bottom surface of the via hole 210a of FIG. 9A, the via hole 210a cannot connect the wiring region 214 to the conductive layer 202. Further, since the ashing process is performed using an oxygen-based plasma after forming the wiring region 214 and the via hole 210a, the process may damage to the surface of the interlayer insulating layer 206b. In other words, $H_2O$, $OH$, $CO_2$, and $H_2$ released during the ashing process may stick to the surface of the interlayer insulating layer 206b, and thus the dielectric constant of the interlayer insulating layer 206b may increase rapidly.

FIG. 10B illustrates the semiconductor substrate 200 after the misaligned second photoresist pattern 212a is removed. As shown in FIG. 10B, the via hole 210a having a width less than the first width $W_1$ is formed, thereby deteriorating the profile of the via hole 210a. Further, when, as described above, photoresist from the mis-aligned second photoresist pattern 212a remains on the bottom surface of the partial via hole 210 (as shown in FIG. 8B), an unopened via hole (not shown) is formed, thereby disconnecting the wiring region 214 and the conductive layer 202.

SUMMARY OF THE INVENTION

It is an object of the present invention to provide a method for forming a metal wiring layer in a semiconductor device that is capable of preventing a metal oxide layer from being generated on a conductive layer during the removal of a second photoresist pattern.

It is another object of the present invention to provide a method for forming a metal wiring layer in a semiconductor device that can prevent photoresist from remaining on the bottom surface of a partial via hole.

It is further object of the present invention to provide a method for forming a metal wiring layer in a semiconductor device that can prevent deterioration of the profile of a via hole even if misalignment of a second photoresist pattern.

According to one aspect of the present invention, a method is provided for forming a metal wiring layer of a semiconductor device. A stopper layer is formed on a semiconductor substrate having a conductive layer. An interlayer insulating layer is formed on the stopper layer. A hard mask layer is formed on the interlayer insulating layer. A first photoresist pattern that comprises a first opening having a first width and partially exposing the surface of the hard mask layer is formed on the hard mask layer. A partial via hole is formed by etching the hard mask layer and portions of the interlayer insulating layer using the first photoresist pattern as an etching mask. The first photoresist pattern is removed. The semiconductor substrate having the partial via hole is coated with an organic material layer to fill the partial via hole with the organic material layer. A second photoresist pattern that comprises a second opening having a second width and formed to be aligned with the partial via hole is formed on the coated semiconductor substrate. The organic material layer and the hard mask layer on the interlayer insulating layer are etched using the second photoresist pattern as an etching mask. At the same time, the second photoresist pattern and the organic material layer are removed. A wiring region having a second width and a via hole having the first width are formed by etching the interlayer insulating layer using the hard mask layer as an etching mask.

In another aspect of the present invention, the method further comprises the steps of removing the stopper layer exposed through the via hole, forming a barrier layer along the step difference of the semiconductor substrate, depositing a conductive material on the semiconductor substrate on which the barrier layer is formed and filling the wiring region and the via hole with the conductive material, and performing chemical mechanical polishing on the semiconductor substrate.

In a further aspect of the present invention, the portions of the interlayer insulating layer is etched to an etch depth that is substantially the same as the thickness of the interlayer insulating layer directly below the partial via hole.

Preferably, the conductive layer comprises a copper wiring layer.

Preferably, the stopper layer comprises one of a silicon nitride layer and a silicon carbide layer, having a high etching selectivity to the interlayer insulating layer.

Preferably, the interlayer insulating layer comprises a material layer having a high etching selectivity to the stopper layer and the hard mask layer and a low dielectric constant.

Preferably, the hard mask layer comprises one of a silicon nitride layer and a silicon carbide layer, having a high etching selectivity to the interlayer insulating layer.

Preferably, the organic material layer comprises a carbon-based bottom anti-reflection coating (BARC) layer.

Preferably, the organic material layer and the hard mask layer on the interlayer insulating layer is etched by using an etching gas comprising one of $O_2$ and both $N_2$ and $H_2$.

Preferably, the barrier layer comprises one of a Ta layer, a TaN layer, a Ti layer, a TiN layer, and a combination thereof.

According to another aspect of the present invention, a method is provided for forming a wiring layer of a semiconductor device according to a second embodiment of the present invention. A first stopper layer is formed on a semiconductor substrate having a conductive layer. A first interlayer insulating layer is formed on the first stopper layer. A second stopper layer is formed on the first interlayer insulating layer. A second interlayer insulating layer is formed on the second stopper layer. A hard mask layer is formed on the second interlayer insulating layer. A first photoresist pattern that comprises a first opening having a first width and partially exposing the surface of the hard mask layer is formed on the hard mask layer. A partial via hole having the first width is formed by etching the hard mask layer, the second interlayer insulating layer, and the second stopper layer using the first photoresist pattern as an etching mask. The first photoresist pattern is removed. The semiconductor substrate having the partial via hole is coated with an organic material layer to fill the partial via hole with the organic material layer. A second photoresist pattern that comprises a second opening aligned with the partial via hole and having a second width is formed on the coated semiconductor substrate. The organic material layer and the hard mask layer on the second interlayer insulating layer are etched using the second photoresist pattern as an etching mask. At the same time, the second photoresist pattern and the organic material layer are removed. A wiring region having the second width and a via hole having the first width in the second and first interlayer insulating layers are formed by etching the second and first interlayer insulating layers, respectively, using the hard mask layer as an etching mask.

According to still another aspect of the present invention, a method is provided for forming a wiring layer of a semiconductor device according to a third embodiment of the present invention. A stopper layer is formed on a semiconductor substrate, on which a conductive layer is formed. An interlayer insulating layer is formed on the stopper layer. A hard mask layer is formed on the interlayer insulating layer. A first photoresist pattern that comprises a first opening having a first width and partially exposing the surface of the hard mask is formed. A partial via hole having the first width is formed by etching the hard mask layer and portions of the interlayer insulating layer using the first photoresist pattern as an etching mask. The first photoresist pattern is removed. The semiconductor substrate having the partial via hole is formed is coated with a spin-on-glass (SOG) layer to fill the partial via hole with the SOG layer. A second photoresist pattern that comprises a second opening aligned with the partial via hole and having a second width is formed on the semiconductor substrate coated with the SOG layer. The SOG layer and the hard mask layer on the interlayer insulating layer are etched using the second photoresist pattern as an etching mask. The second photoresist pattern is removed. The SOG layer formed on the hard mask layer and in the partial via hole is wet-etched and removed. A wiring region having the second width and a via hole having the first width are formed by etching the interlayer insulating layer using the hard mask layer as an etching mask.

According to further aspect of the present invention, a method is provided for forming a wiring layer of a semiconductor device according to a fourth embodiment of the present invention. A first stopper layer is formed on a semiconductor substrate, on which a conductive layer is formed. A first interlayer insulating layer is formed on the first stopper layer. A second stopper layer is formed on the first interlayer insulating layer. A second interlayer insulating layer is formed on the second stopper. A hard mask layer is formed on the second interlayer insulating layer. A first photoresist pattern that comprises a first opening having a first width and partially exposing the surface of the hard mask layer is formed on the hard mask layer. A partial via hole having the first width is formed by etching the hard mask layer, the second interlayer insulating layer, and the second stopper layer using the first photoresist pattern as an etching mask. The first photoresist pattern is removed. The semiconductor substrate having the partial via hole is coated with a spin-on-glass (SOG) layer to fill the partial via hole with the SOG layer. A second photoresist pattern that comprises a second opening aligned with the partial via hole and having a second width is formed on the coated semiconductor substrate. The SOG layer and the hard mask layer on the second interlayer insulating layer are etched using the second photoresist pattern as an etching mask. The second photoresist pattern is removed. The SOG layer formed on the hard mask layer and in the partial via hole is wet-etched and removed. A wiring region having the second width and a via hole in the second and first interlayer insulating layers are formed by etching the second and first interlayer insulating layers, respectively, using the hard mask layer as an etching mask.

According to another aspect of the invention, a method is provided for forming a wiring layer of a semiconductor device according to a fifth embodiment of the present invention. The method comprises the steps of forming a stopper layer on a semiconductor substrate that has a conductive layer formed thereon; forming an interlayer dielectric layer on the stopper layer; forming a hard mask layer on the interlayer dielectric layer; forming a first photoresist pattern on the hard mask layer, the first photoresist pattern having a first opening corresponding to the conductive layer; etching the hard mask layer and the interlayer dielectric layer using the first photoresist pattern as an etching mask to form a via hole in the interlayer dielectric layer through which a portion of the stopper layer is exposed; removing the first photoresist pattern; filling the via hole with an intermediary material layer; etching a portion of the hard mask layer to form a hard mask pattern that defines a wiring region, wherein the hard mask pattern comprises a second opening that overlaps the entire via hole or at least a portion of the via hole; removing the intermediary material layer from the via hole; forming the wiring region by etching a portion of the interlayer dielectric layer using the hard mask pattern as an etching mask; removing a portion of the stopper layer exposed by the via hole; and filling the via hole and the wiring region with a conductive material.

Preferably, the hard mask layer comprises a silicon oxide layer, a silicon nitride layer, a silicon carbide layer, a polysilicon layer, a metal oxide layer, a metal nitride layer, or a metal layer, and has a high etching selectivity with respect to the interlayer dielectric layer.

Preferably, the intermediary material layer comprises a BARC layer or an SOG layer, which has an etching selectivity with respect to the interlayer dielectric layer.

Preferably, the SOG layer is an HSQ layer, an MSQ layer, or a porous $SiO_2$ layer, which is an inorganic material layer having an etching selectivity with respect to the interlayer dielectric layer.

According to another aspect of the invention, a method is provided for forming a wiring layer of a semiconductor device according to a sixth embodiment of the present invention. The method comprises the steps of forming a first stopper layer on a semiconductor substrate that has a conductive layer formed thereon; forming a first interlayer dielectric layer on the first stopper layer; forming a second stopper layer on the first interlayer dielectric layer; forming a second interlayer dielectric layer on the second stopper layer; forming a hard mask layer on the second interlayer dielectric layer; forming a first photoresist pattern on the hard mask layer, the first photoresist pattern having a first opening corresponding to the conductive layer; etching the hard mask layer, the second interlayer dielectric layer, the second stopper layer, and the first interlayer dielectric layer to form a via hole in the second interlayer dielectric layer, the second stopper layer and the first interlayer dielectric layer using the first photoresist pattern as an etching mask and the first stopper layer as an etch stop; removing the first photoresist pattern; filling the via hole with an intermediary material layer; etching a portion of the hard mask layer to form a hard mask pattern that defines a wiring region, wherein the hard mask pattern comprises a second opening that overlaps the entire via hole or at least a portion of the via hole; removing the intermediary material layer from the via hole; forming the wiring region by etching a portion of the second interlayer dielectric down to the second stopper layer using the hard mask pattern as an etching mask; removing a portion of the first stopper layer exposed by the via hole; and filling the via hole and the wiring region with a conductive material.

These and other aspects, objects, features and advantages of the present invention will become apparent from the following detailed description of preferred embodiments thereof, which is to be read in connection with the accompanying drawings.

BRIEF DESCRIPTION OF THE DRAWINGS

FIGS. 6 through 10B are cross-sectional views of another metal wiring layer in a semiconductor device formed according to another conventional method.

DETAILED DESCRIPTION OF PREFERRED EMBODIMENTS

Figure 1:
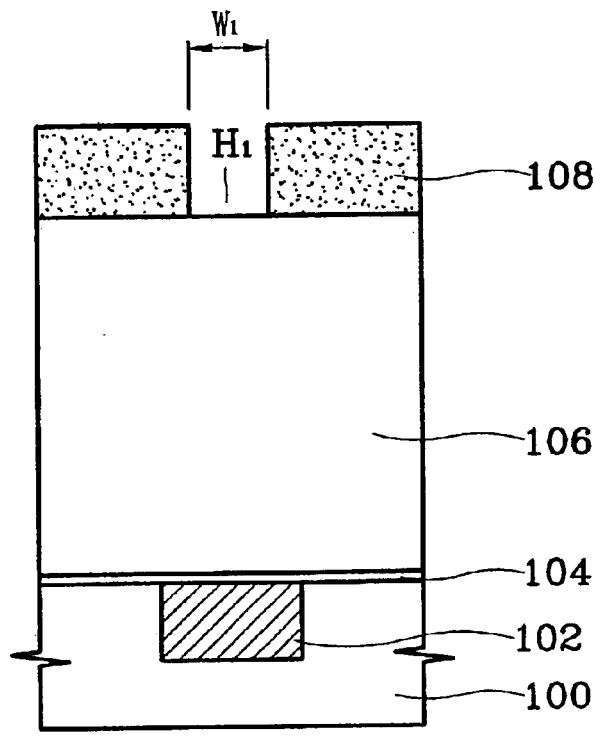
FIGS. 1 through 6 are cross-sectional views of a metal wiring layer in a semiconductor device formed according to a conventional method.
Figure 2:
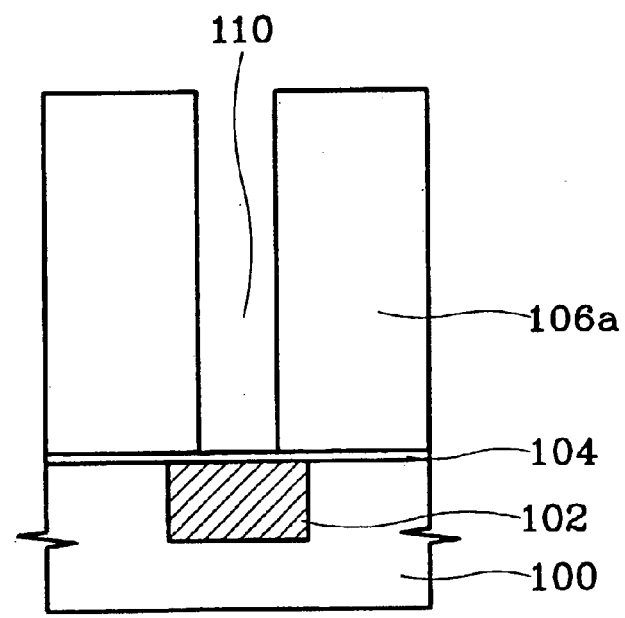
Figure 3:
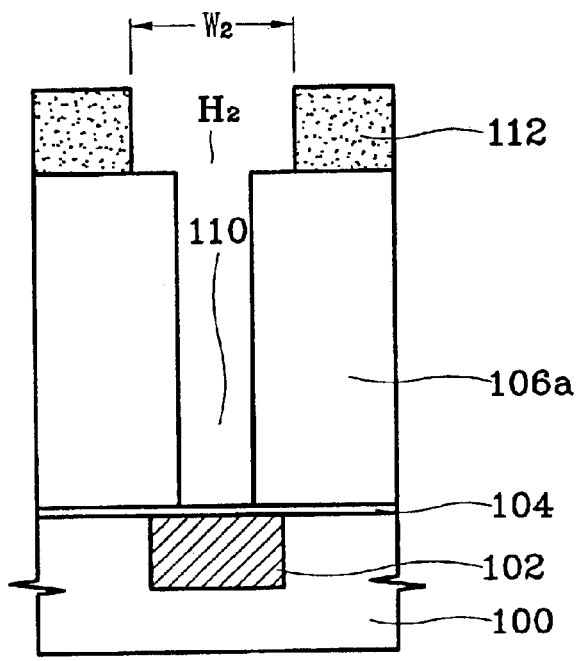
Figure 4:
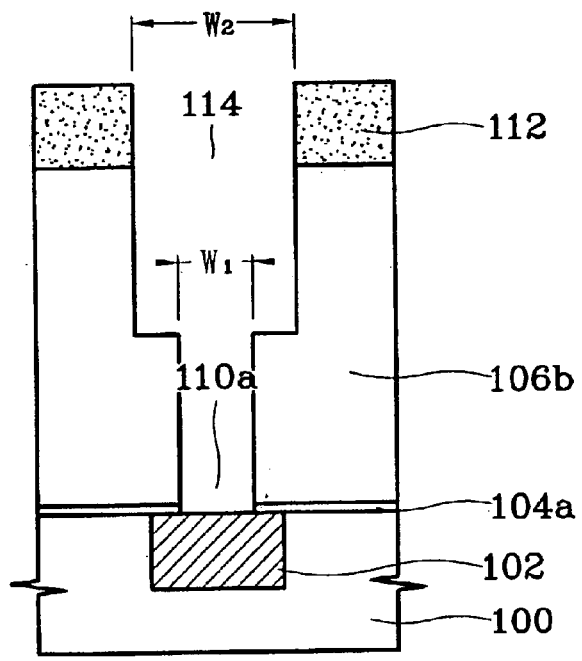
Figure 5:
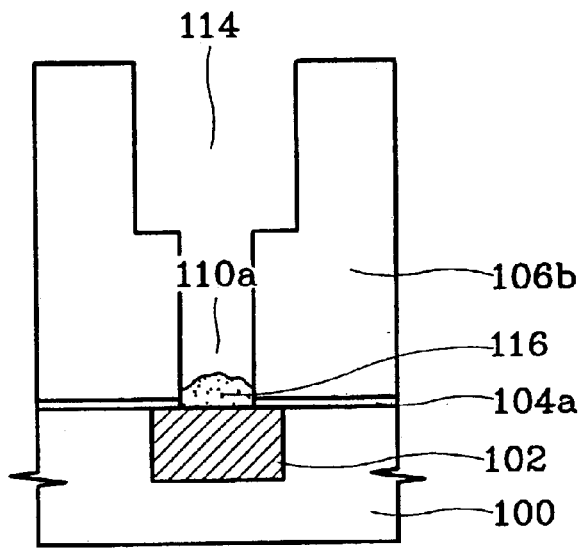
Figure 6:
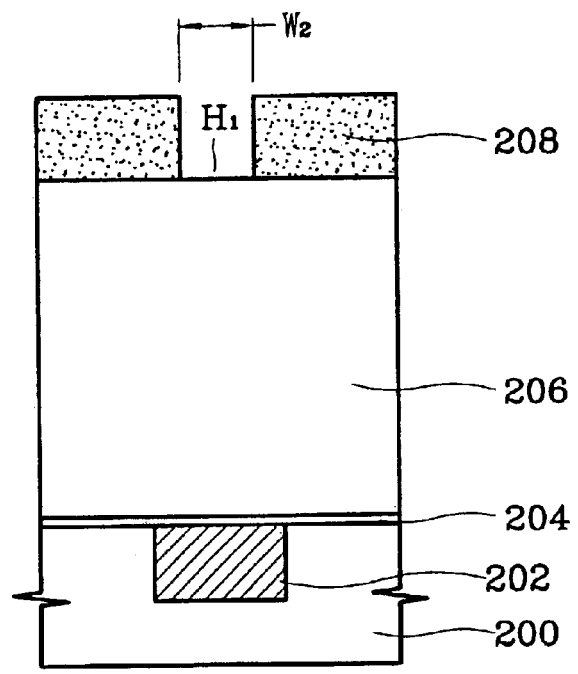
Figure 7:
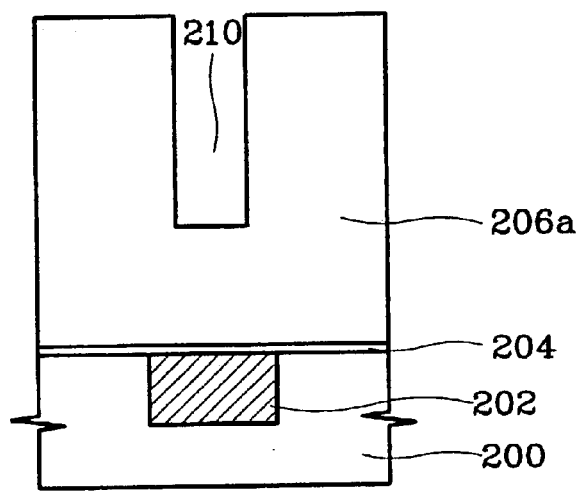
Figure 8A:
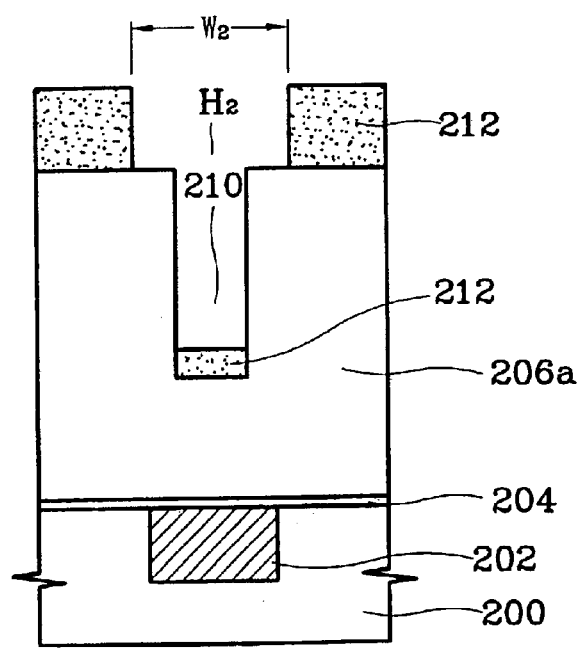
Figure 8B:
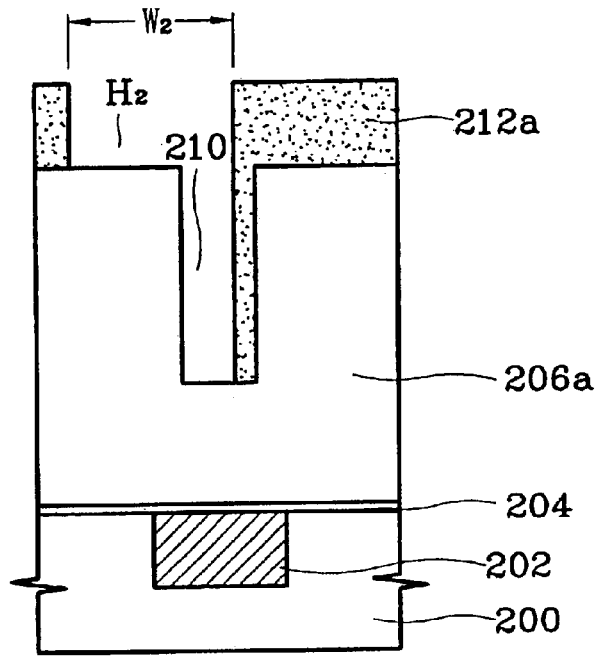
Figure 9A:
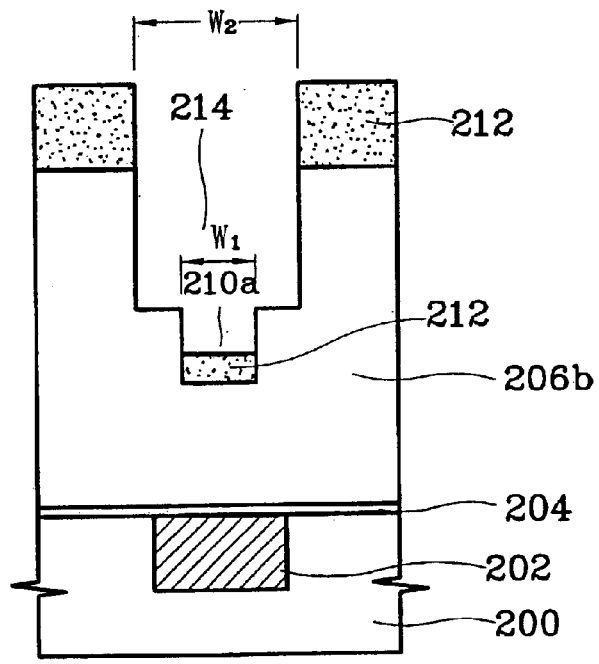
Figure 9B:
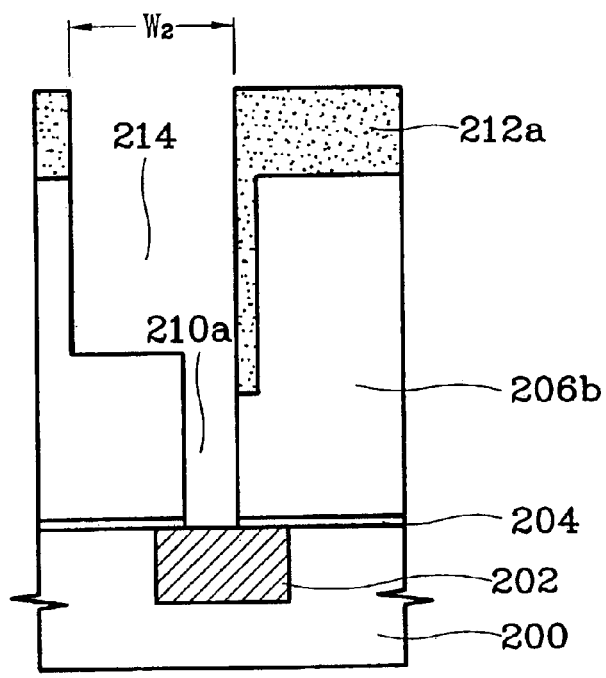
Figure 10A:
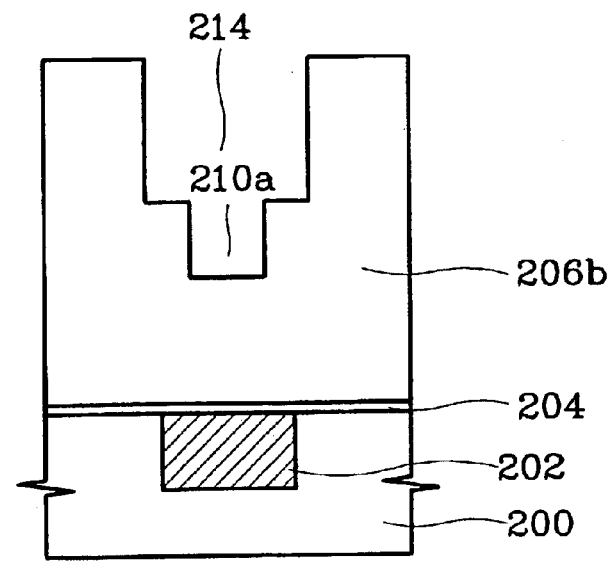
Figure 10B:
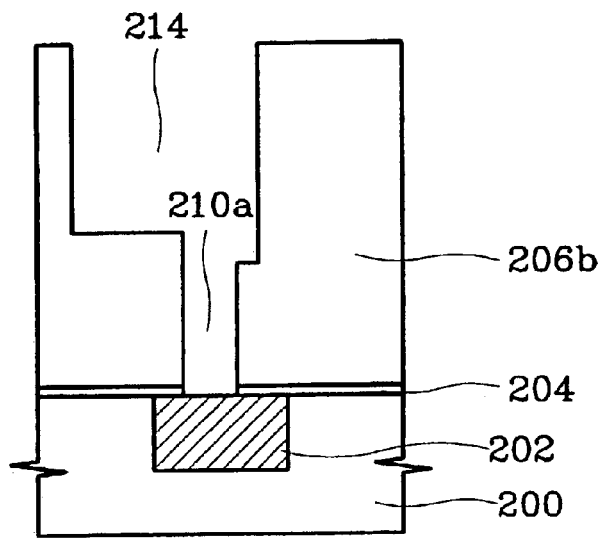

The present invention will now be described more fully with reference to the accompanying drawings, in which preferred embodiments of the invention are shown. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Similar reference numerals denote elements having the same or similar functions, and thus their description will be omitted.

Figure 11:
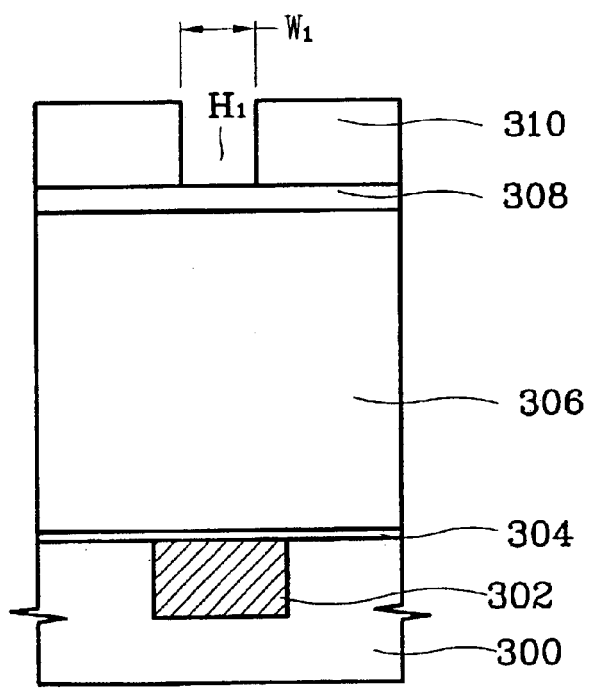
FIGS. 11 through 19 are cross-sectional views of a metal wiring layer in a semiconductor device illustrating a method for forming a metal wiring layer according to a first embodiment of the present invention.

FIGS. 11 through 19 are cross-sectional views of a metal wiring layer in a semiconductor device illustrating a method for forming a metal wiring layer according to a first embodiment of the present invention. Referring to FIG. 11, a stopper layer 304 is formed on a semiconductor substrate 300, on which a predetermined conductive layer 302 has been formed. The conductive layer 302 comprises an impurity-doped region, a copper (Cu) wiring layer, or another metal wiring layer. The stopper layer 304 is preferably formed of a material having a high etching selectivity to an interlayer insulating layer 306 (which is formed on the stopper layer 304) such as a silicon nitride ($Si_3N_4$) layer or a silicon carbide (SiC) layer.

The interlayer insulating layer 306 is formed on the stopper layer 304. The interlayer insulating layer 306 preferably comprises a material having a low dielectric constant, for example, a SiOC layer, a porous $SiO_2$ layer, a phosphorous silicate glass (PSG) layer, a boron phosphorous silicate glass (BPSG) layer, an undoped silicate glass (USG) layer, a fluorine-doped silicate glass (FDSG) layer, a high-density plasma (HDP) layer, a plasma-enhanced tetraethylorthosilicate (PE-TEOS) layer, or a spin-on-glass (SOG) layer. Further, the interlayer insulating layer 306 preferably comprises a material having a high etching selectivity to the stopper layer 304.

A hard mask layer 308 is formed on the interlayer insulating layer 306. The hard mask layer 308 is preferably formed of a material having a high etching selectivity to the interlayer insulating layer 306 such as a silicon nitride layer or a silicon carbide layer.

A first photoresist pattern 310 is formed on the hard mask layer 308. The first photoresist pattern 310 comprises a first opening $H_1$ having a first width $W_1$ and partially exposing the surface of the hard mask layer 308. For instance, the hard mask layer 308 is covered with photoresist and then the photoresist is exposed to light and developed, thereby forming the first photoresist pattern 310.

Figure 12:
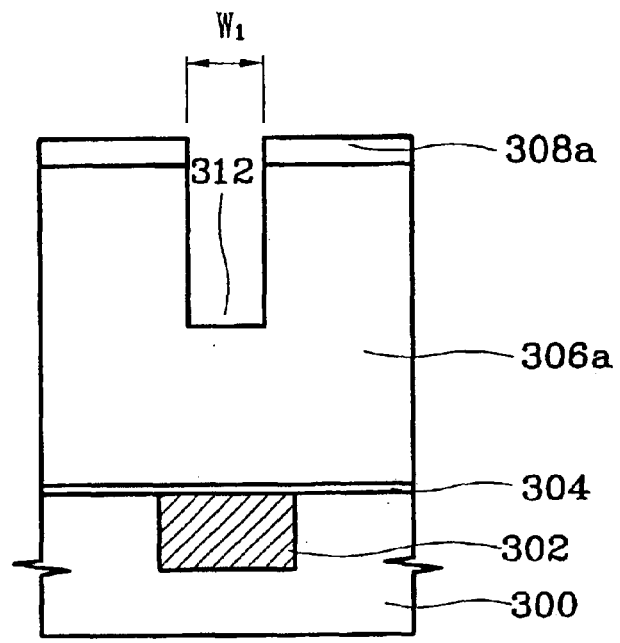

Referring to FIG. 12, the hard mask layer 308 and portions of the interlayer insulating layer 306 are etched using the first photoresist pattern 310 as an etching mask. At this time, a predetermined thickness of an interlayer insulating layer 306a is left without being etched. For instance, the depth to which the interlayer insulating layer 306 is etched, that is, the depth of a partial via hole 312, is substantially the same as the thickness of the interlayer insulating layer 306a left after the etching process. Next, the first photoresist pattern 310 is removed by a typical method such as an ashing process.

Figure 13:
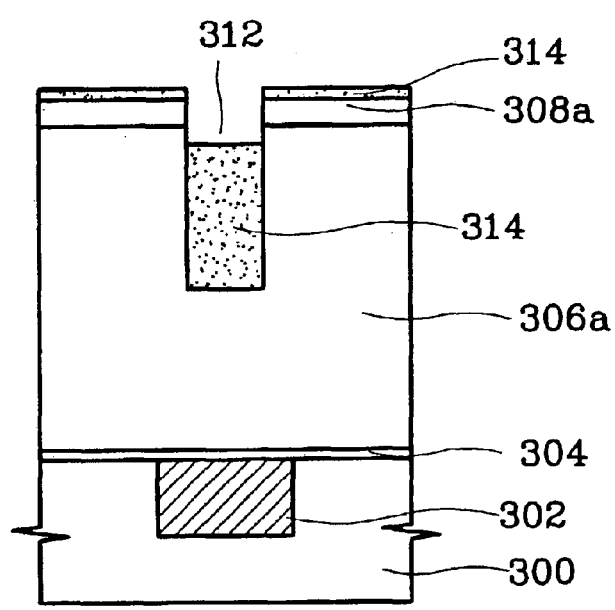

Referring to FIG. 13, an organic material layer 314 is formed on the semiconductor substrate 300, in which the partial via hole 312 has been formed, so as to fill the partial via hole 312 with the organic material layer 314. The organic material layer 314 may be formed only in the partial via hole 312 or may also be thinly formed on a hard mask layer 308a. The organic material layer 314 preferably comprises a carbon-based organic material, for example, a bottom anti-reflection coating (BARC) layer. The organic material layer 314 may be formed by a spin coating method, in which case the spin coater spins at about 1000–1500 rpm. After coating the semiconductor substrate 300 with the organic material layer 314, the semiconductor substrate 300 is baked at a temperature between 100° C. and 150° C.

Figure 14:
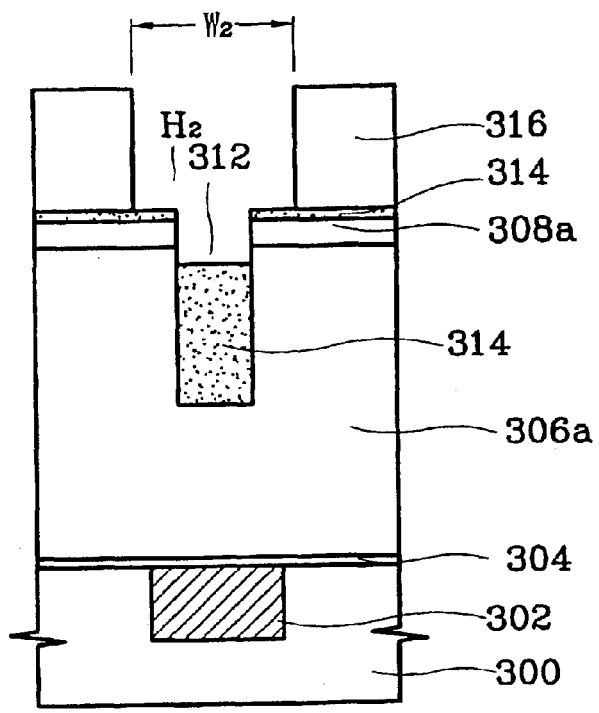

Referring to FIG. 14, a second photoresist pattern 316 is formed on the semiconductor substrate 300 having the organic material layer 314. The second photoresist pattern 316 comprises a second opening $H_2$ having a second width $W_2$ greater than the first width $W_1$ and partially exposing the organic material layer 314. The second opening $H_2$ is formed to be aligned with the partial via hole 312 and to be positioned on the partial via hole 312.

Figure 15:
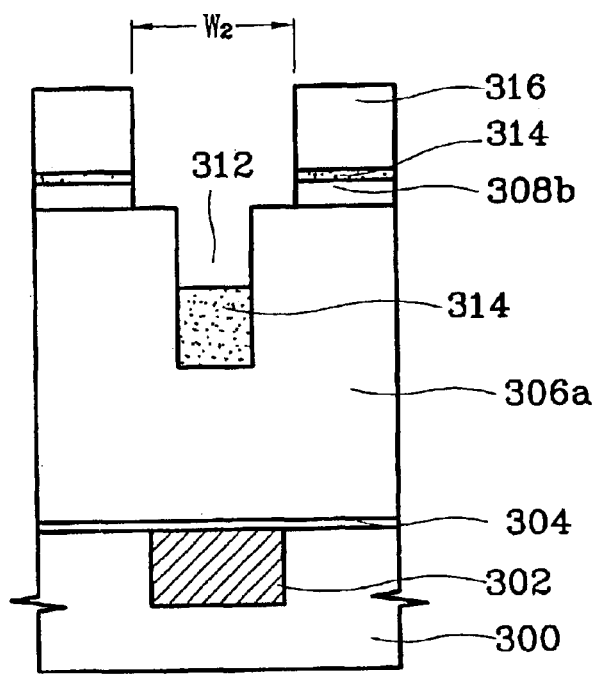

Referring to FIG. 15, the organic material layer 314 and the hard mask layer 308a on the interlayer insulating layer 306a are dry-etched using the second photoresist pattern 316 as an etching mask. At this time, an etching gas comprises one of oxygen ($O_2$) and both $N_2$ and $H_2$. Further, the etching gas may comprise one of a $C_xF_y$-based gas, a $C_xH_yF_z$-based gas, an inert gas, such as Ar, and a gas comprising CO or $O_2$. The organic material layer 314 in the partial via hole 312 is recessed to a predetermined depth due to the process for etching the organic material layer 314 and the hard mask layer 308a.

Figure 16:
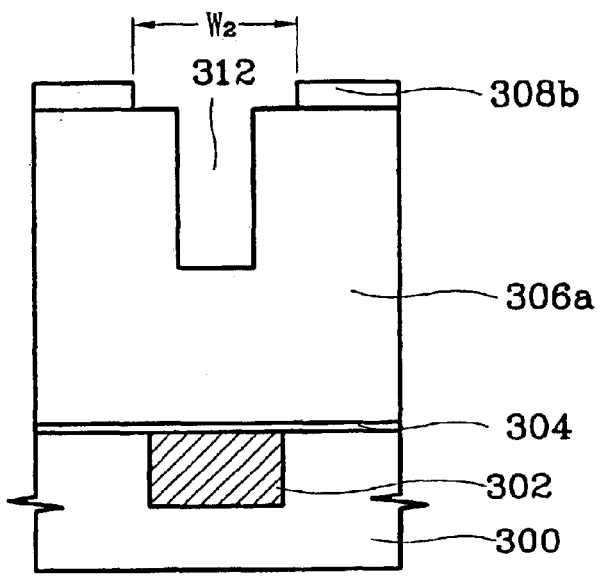

Referring to FIG. 16, the second photoresist pattern 316 is removed. The second photoresist pattern 316 may be removed by a typical method such as an ashing process. At this time, the organic material layer 314 is removed along with the second photoresist pattern 316. In other words, the organic material existing on the hard mask layer 308a and in the partial via hole 312 is removed in the process for removing the second photoresist pattern 316. After the second photoresist pattern 316 and the organic material layer 314 are removed, a hard mask layer 308b having an opening with the second width $W_2$ is exposed.

Figure 17:
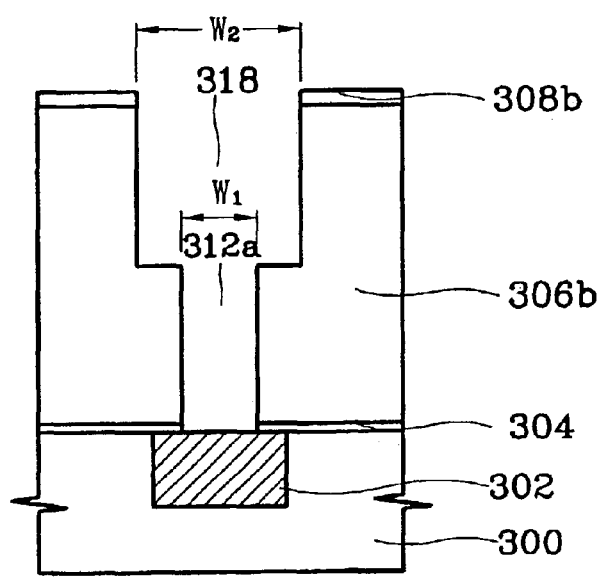

Referring to FIG. 17, the interlayer insulating layer 306a is dry-etched using the hard mask layer 308b as an etching mask, thereby simultaneously forming a wiring region 318 and a via hole 312a. In other words, the wiring region 318 having the second width $W_2$ is formed in the interlayer insulating layer 306b, and the via hole 312a having the first width $W_1$ less than the second width $W_2$ is formed under the wiring region 318. Since the hard mask layer 308b is used as an etching mask, the hard mask layer 308b has a sufficient thickness to endure the process for etching the interlayer insulating layer 306a.

Next, the stopper layer 304 exposed through the via hole 312a is etched and removed. At this time, the hard mask layer 308b may be etched and removed along with the stopper layer 304 exposed through the via hole 312a or may be left. For instance, the hard mask layer 308b, in FIG. 17, is left on the interlayer insulating layer 306a.

Figure 18:
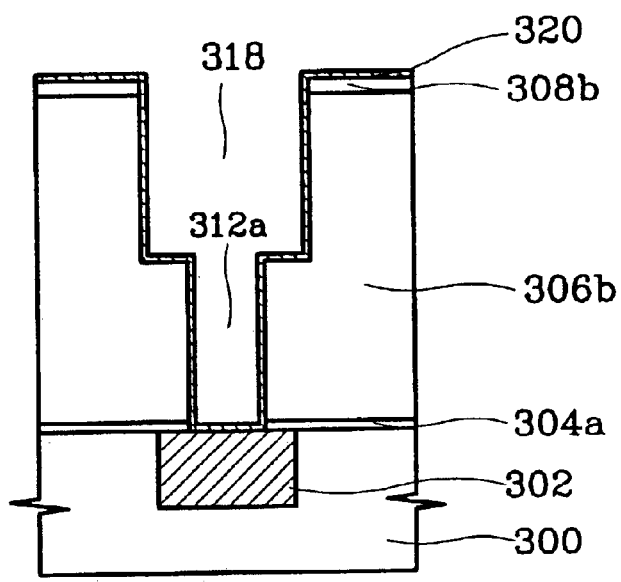

Referring to FIG. 18, a barrier layer 320 is formed along the step difference of the semiconductor substrate 300 after the stopper layer 304 is removed. The barrier layer 320 preferably comprises one of a Ta layer, a TaN layer, a Ti layer, a TiN layer, and a combination thereof.

Figure 19:
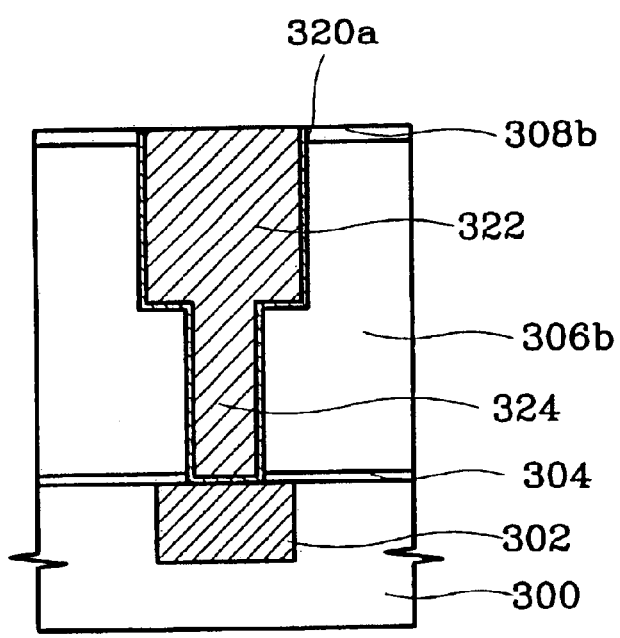

Referring to FIG. 19, a conductive material is deposited to fill the wiring region 318 and the via hole 312a. Next, the semiconductor substrate 300 is planarized by chemical mechanical polishing. At this time, the barrier layer 320 on the hard mask layer 308b is removed by chemical vapor polishing. Through the planarization process, a metal wiring layer 322 is formed in the wiring region 318, and a via contact 324 connecting the conductive layer 302 to the metal wiring layer 322 is formed in the via hole 312a. The hard mask layer 308b may be removed by chemical mechanical polishing which is performed until the interlayer insulating layer 306b is exposed. Alternatively, the hard mask layer 308b may be left.

Figure 20:
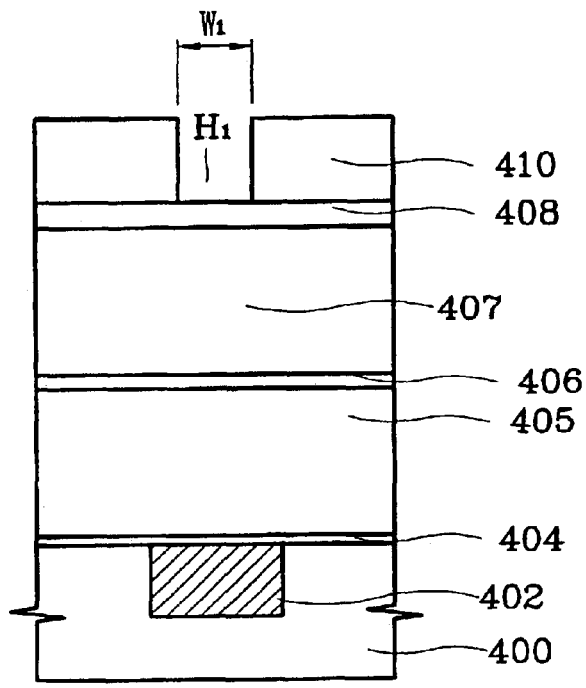
FIGS. 20 through 26 are cross-sectional views of a metal wiring layer in a semiconductor device illustrating a method for forming a metal wiring layer according to a second embodiment of the present invention.

FIGS. 20 through 26 are cross-sectional views of a metal wiring layer in a semiconductor device illustrating a method for forming a metal wiring layer according to a second embodiment of the present invention. Referring to FIG. 20, a first stopper layer 404 is formed on a semiconductor substrate 400, on which a predetermined conductive layer 402 has been formed. The conductive layer 402 may comprise an impurity-doped region, a copper (Cu) wiring layer, or another metal wiring layer formed on the semiconductor substrate 400. The first stopper layer 404 preferably comprises a material having a high etching selectivity to a first interlayer insulating layer 405 (which is to be formed on the first stopper layer 404) such as a silicon nitride ($Si_3N_4$) layer or a silicon carbamide (SiC) layer.

The first interlayer insulating layer 405 is formed on the first stopper layer 404. The first interlayer insulating layer 405 preferably comprises a material having a low dielectric constant, for example, a SiOC layer, a porous $SiO_2$ layer, a phosphorous silicate glass (PSG) layer, a boron phosphorous silicate glass (BPSG) layer, an undoped silicate glass (USG) layer, a fluorine-doped silicate glass (FDSG) layer, a high-density plasma (HDP) layer, a plasma-enhanced tetraethylorthosilicate (PE-TEOS) layer, or a spin-on-glass (SOG) layer. Further, the first interlayer insulating layer 405 preferably comprises a material having a high etching selectivity to the first stopper layer 404.

A second stopper layer 406 is formed on the first interlayer insulating layer 405. The second stopper layer 406 preferably comprises a material having a high etching selectivity to a second interlayer insulating layer 407 (which is to be formed on the second stopper layer 406) such as a silicon nitride ($Si_3N_4$) layer or a silicon carbamide (SiC) layer.

The second interlayer insulating layer 407 is preferably comprises a material having a low dielectric constant such as a SiOC layer, a porous $SiO_2$ layer, a phosphorous silicate glass (PSG) layer, a boron phosphorous silicate glass (BPSG) layer, an undoped silicate glass (USG) layer, a fluorine-doped silicate glass (FDSG) layer, a high-density plasma (HDP) layer, a plasma-enhanced tetraethylorthosilicate (PE-TEOS) layer, or a spin-on-glass (SOG) layer. Further, the second interlayer insulating layer 407 preferably comprises a material having a high etching selectivity to the second stopper layer 406. The second interlayer insulating layer 407 may be formed of a different material from the material of the first interlayer insulating layer 405 or may be formed of the same material as the first interlayer insulating layer 405. For example, the second interlayer insulating layer 407, in FIG. 20, is preferably formed of the same material as the first interlayer insulating layer 405.

A hard mask layer 408 is formed on the second interlayer insulating layer 407. The hard mask layer 408 preferably comprises a material having a high etching selectivity to the second interlayer insulating layer 407 such as a silicon nitride ($Si_3N_4$) layer or a silicon carbide (SIC) layer.

A first photoresist pattern 410 is formed on the hard mask layer 408. The first photoresist pattern 410 comprises a first opening $H_1$ having a first width $W_1$ and partially exposing the surface of the hard mask layer 408. In other words, photoresist is formed on the hard mask layer 408 and then is exposed to light and developed, thereby forming the first photoresist pattern 410.

Figure 21:
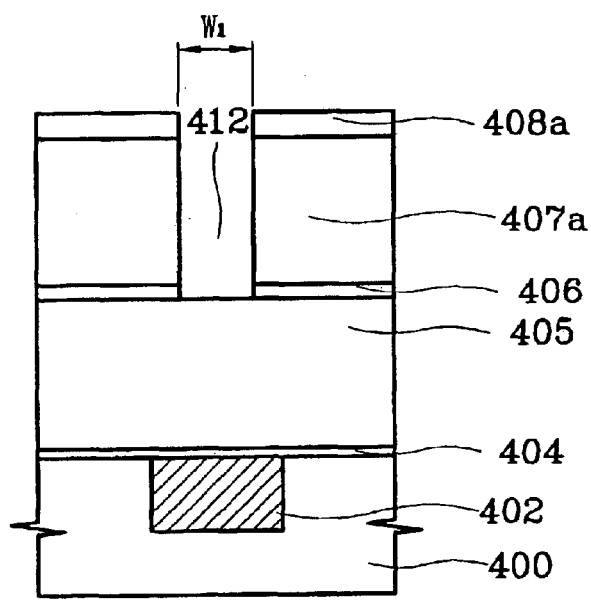

Referring to FIG. 21, the hard mask layer 408, the second interlayer insulating layer 407, and the second stopper layer 406 are etched using the first photoresist pattern 410 as an etching mask, thereby forming a partial via hole 412 having the first width $W_1$ on a second interlayer insulating layer 407a. Next, the first photoresist pattern 410 is removed. The first photoresist pattern 410 may be removed by a typical method such as an ashing process.

Figure 22:
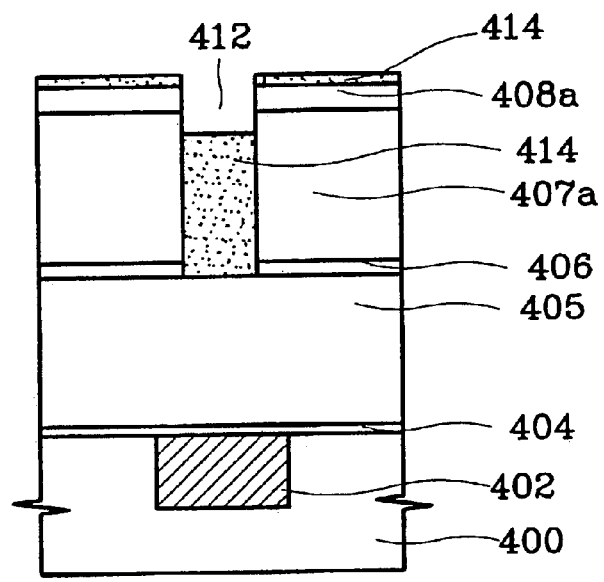

Referring to FIG. 22, an organic material layer 414 is formed on the semiconductor substrate 400, on which the partial via hole 412 has been formed, so as to fill the partial via hole 412 with the organic material layer 414. The organic material layer 414 may be formed in only the partial via hole 412 or may also be thinly formed on a hard mask layer 408a. The organic material layer 414 preferably comprises a carbon-based organic material, for example, a bottom anti-reflection coating (BARC) layer. The organic material layer 414 may be formed by spin coating, in which case a spin coater spins at about 1000–5000 rpm. After coating the semiconductor substrate 400 with the organic material layer 414, the semiconductor substrate 400 is baked at a temperature between 100° C. and 150° C.

Figure 23:
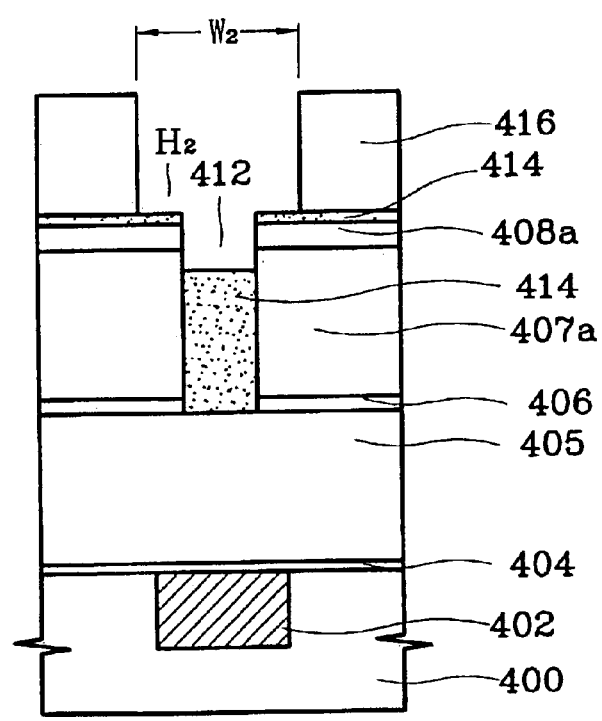

Referring to FIG. 23, a second photoresist pattern 416 is formed on the semiconductor substrate 400, on which the organic material layer 414 has been formed. The second photoresist pattern 416 comprises a second opening $H_2$ having the second width $W_2$ greater than the first width $W_1$, and partially exposing the organic material layer 414. The second opening $H_2$ is formed to be aligned with the partial via hole 412 and to be positioned on the partial via hole 412.

Figure 24:
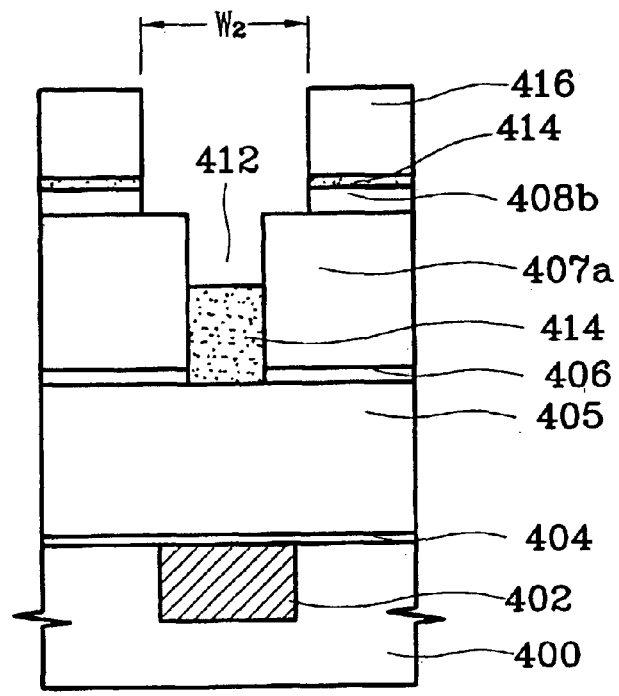

Referring to FIG. 24, the organic material layer 414 and the hard mask layer 408a on a second interlayer insulating layer 407a are dry-etched using the second photoresist pattern 416 as an etching mask. At this time, an etching gas comprises one of a gas comprising oxygen ($O_2$) and a gas comprising $N_2$ and $H_2$. Alternatively, the etching gas may comprise one of a $C_xF_y$-based gas, a $C_xH_yF_z$-based gas, an inert gas, such as Ar, and a gas comprising CO or $O_2$. The organic material layer 414 in the partial via hole 412 is recessed to a predetermined depth due to the process for etching the organic material layer 414 and the hard mask layer 408a.

Figure 25:
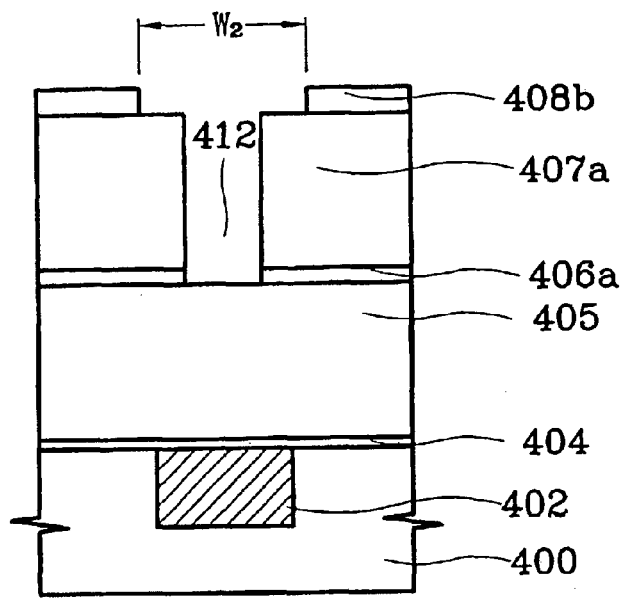

Referring to FIG. 25, the second photoresist pattern 416 is removed. The second photoresist pattern 416 may be removed by a typical method such as an ashing process. At this time, the organic material layer 414 is removed along with the second photoresist pattern 416. In other words, the organic material layer 414 existing on the hard mask layer 408b or in the partial via hole 412 is removed in the process for removing the second photoresist pattern 416. After the second photoresist pattern 416 and the organic material layer 414 are removed, the hard mask layer 408b having an opening with the second width $W_2$ is exposed.

Figure 26:
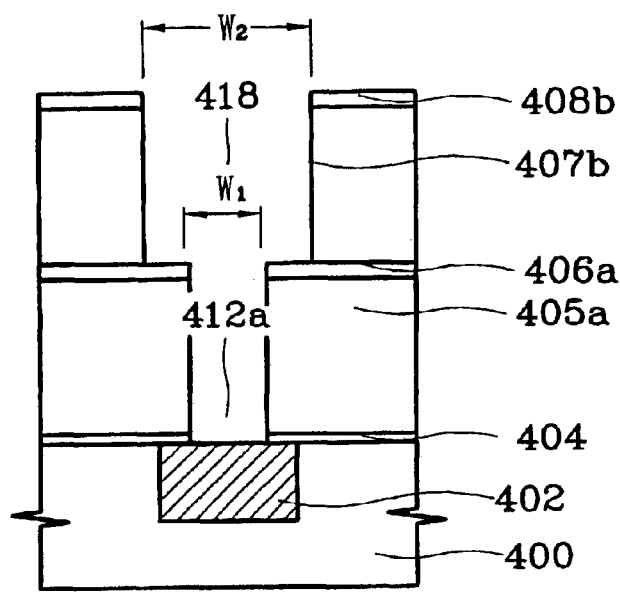

Referring to FIG. 26, the second interlayer insulating layer 407a and the first interlayer insulating layer 405 are dry-etched using the hard mask layer 408b as an etching mask, thereby simultaneously forming a wiring region 418 and a via hole 412a. In other words, the wiring region 418 having the second width $W_2$ is formed in a second interlayer insulating layer 407b, and the via hole 412a having the first width $W_1$ less than the second width $W_2$ is formed in the first interlayer insulating layer 405a.

Next, the first stopper layer 404 exposed by the via hole 412a is etched and removed. A hard mask layer 408b may be etched and removed along with the first stopper layer 404 exposed by the via hole 412a, or it may be left. Subsequent processes are the same as those of the first embodiment of the present invention.

Figure 27:
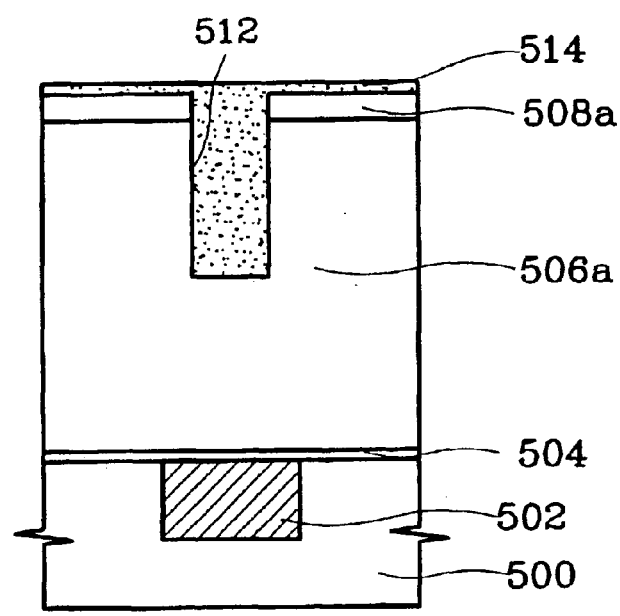
FIGS. 27 through 31 are cross-sectional views of a metal wiring layer in a semiconductor device illustrating a method for forming a metal wiring layer according to a third embodiment of the present invention.

FIGS. 27 through 31 are cross-sectional views of a metal wiring layer in a semiconductor device illustrating a method for forming a metal wiring layer according to a third embodiment of the present invention. Referring to FIG. 27, a stopper layer 504, an interlayer insulating layer 506, and a hard mask layer 508 are sequentially formed on a semiconductor substrate 500, on which a predetermined conductive layer 502 has been formed. Next, a first photoresist pattern (not shown) that comprises an opening having a first width $W_1$ and partially exposing the surface of the hard mask layer 508 is formed on the semiconductor device. A partial via hole 512 is formed by etching the hard mask layer 508 and portions of the interlayer insulating layer 506 using the first photoresist pattern as an etching mask. The first photoresist pattern is removed. The above-described steps are the same as the corresponding steps of the first embodiment of the present invention. Here, the interlayer insulating layer 506 preferably comprises a material having a low dielectric constant such as a SiOC layer.

A spin-on-glass (SOG) layer 514 is formed on the semiconductor substrate 500, on which the partial via hole 512 has been formed, by spin coating. After coating the semiconductor substrate 500 with the SOG layer 514, the semiconductor substrate 500 is preferably baked at a temperature of 250–350° C. for about 30 seconds~5 minutes. The SOG layer 514 preferably comprises a material having high wet-etching selectivity to the interlayer insulating layer 506a such as a hydro silsesquioxane (HSQ) layer or a $SiO_2$ layer. For example, the SOG layer 514 such as a HSG layer is rapidly etched in a HF solution, while the interlayer insulating layer 506a such as a SiOC layer is hardly etched in the HF solution. For example, if a HSQ layer, a SiOC layer, and a SiC layer are wet-etched in a HF aqueous solution for 90 seconds (in which HF is diluted with water to a ratio of 1:500), the HSQ layer is etched to a thickness of 470 Å, the SiOC layer is etched to a thickness of 15–31 Å, and the SiC layer is etched to a thickness of 13 Å.

Figure 28:
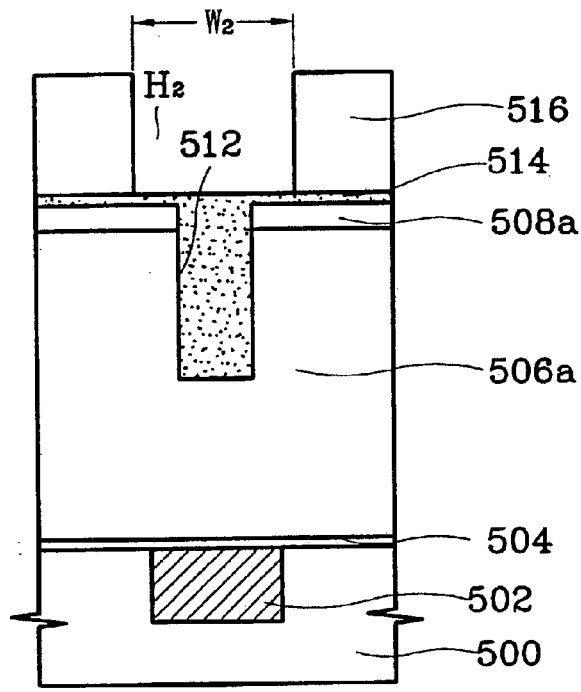

Referring to FIG. 28, a second photoresist pattern 516 is formed on the SOG layer 514. The second photoresist pattern 516 comprises a second opening $H_2$ having a second width $W_2$ greater than the first width $W_1$ and partially exposing the SOG layer 514. The second opening $H_2$ is formed to be aligned with the partial via hole 512. When the SOG layer 514 and the hard mask layer 508a are etched using the second photoresist pattern 516 as an etching mask, the partial via hole 514 formed in the interlayer insulating layer 506a is exposed.

Figure 29:
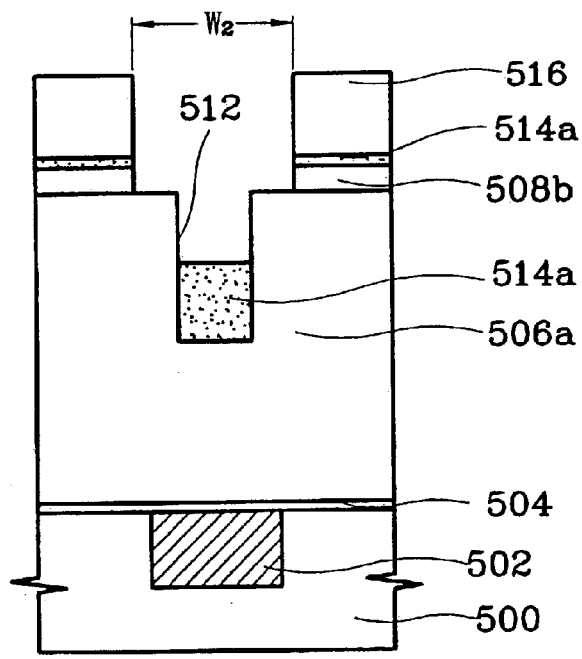

Referring to FIG. 29, the SOG layer 514 and the hard mask layer 508a on the interlayer insulating layer 506a are dry-etched using the second photoresist pattern 516 as an etching mask. At this time, an etching gas may comprise one of a $C_xF_y$-based gas, a $C_xH_yF_z$-based gas, an inert gas, such as Ar, and a gas comprising CO, $CO_2$ or $O_2$. The dry etching is preferably performed at a pressure of 5–50 mTorr with a power of 1000~5000 W for about 1~2 minutes. During the dry etching, the SOG layer 514 filling the partial via hole 512 is recessed to a predetermined depth. The SOG layer 514 may be completely removed depending on etching conditions.

Figure 30:
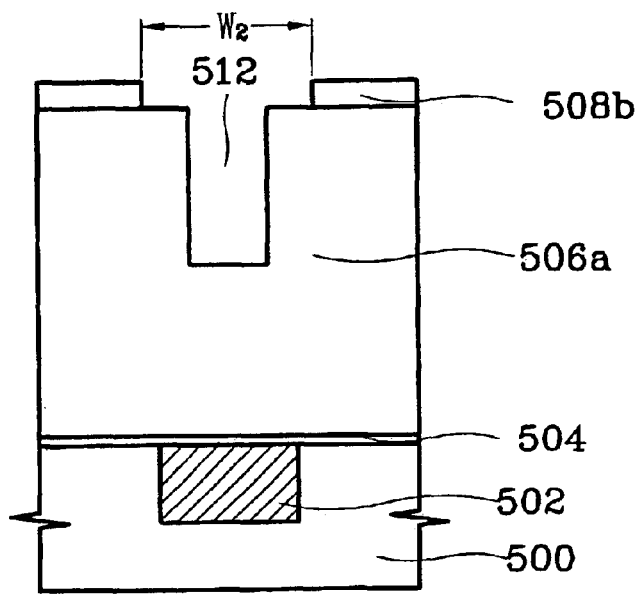

Referring to FIG. 30, the second photoresist pattern 516 is removed. The second photoresist pattern 516 may be removed by a typical method, such as an ashing process.

A SOG layer 514a formed on the hard mask layer 508b and in the partial via hole 512 is wet-etched and removed. At this time, an etching solution, for example, HF solution, preferably etches the SOG layer 514a faster than the interlayer insulating layer 506a, thereby removing only the SOG layer 514a. For example, the SOG layer 514a such as a HSQ layer is etched very fast in a HF solution, whereas the interlayer insulating layer 506a such as a SiOC layer is hardly etched in the HF solution. For example, if a HSQ layer, a SiOC layer, and a SiC layer are wet-etched in a HF solution for 90 seconds (in which HF is diluted with water to a ratio of 1:500), the HSQ layer is etched to a thickness of 470 Å, the SiOC layer is etched to a thickness of 15–31 Å, and the SiC layer is etched to a thickness of 13 Å.

When the second photoresist pattern 516 and the SOG layer 514a are removed, the hard mask layer 508b, in which an opening having the second width $W_2$ is formed, is exposed.

Figure 31:
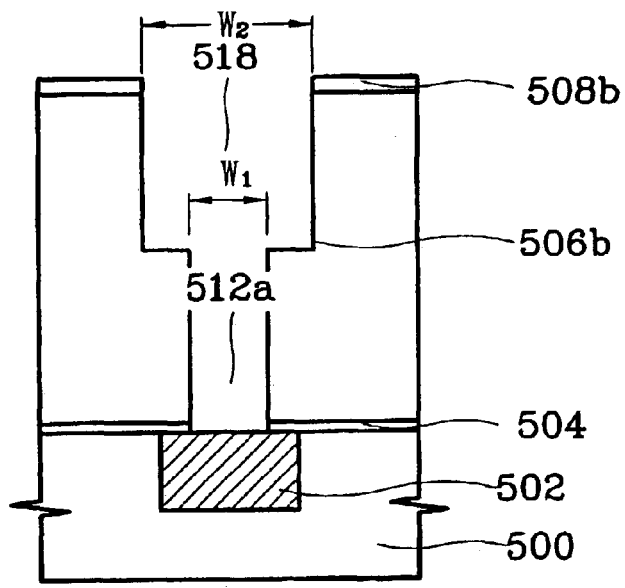

Referring to FIG. 31, subsequent processes are the same as those of the first embodiment of the present invention. In other words, a process for simultaneously forming a wiring region 518 and a via hole 512a by dry-etching the interlayer insulating layer 506a using the hard mask layer 508b as an etching mask and the subsequent processes are the same as those of the first embodiment of the present invention.

Figure 32:
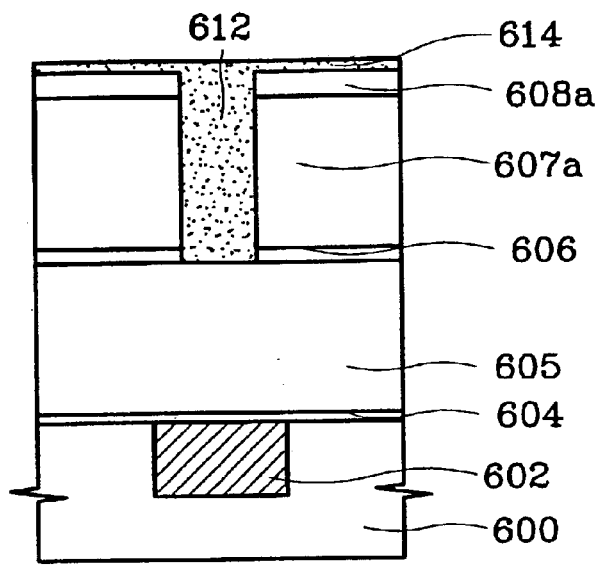
FIGS. 32 through 36 are cross-sectional views of a metal wiring layer in a semiconductor device illustrating a method for forming a metal wiring layer according to a fourth embodiment of the present invention.

FIGS. 32 through 36 are cross-sectional views of a metal wiring layer in a semiconductor device illustrating a method for forming a metal wiring layer according to a fourth embodiment of the present invention. Referring to FIG. 32, a first stopper layer 604, a first interlayer insulating layer 605, a second stopper layer 606, a second interlayer insulating layer 607, and a hard mask layer 608 are sequentially formed on a semiconductor substrate 600, on which a predetermined conductive layer 602 has been formed. A first photoresist pattern (not shown) that comprises an opening having a first width $W_1$ and partially exposing the surface of the hard mask layer 608 is formed on the semiconductor substrate 600. The hard mask layer 608, the second interlayer insulating layer 607, and the second stopper layer 606 are etched using the first photoresist pattern (not shown) as an etching mask, thereby forming a partial via hole 612. The first photoresist pattern is removed. The above-described steps are the same as the corresponding steps of the second embodiment of the present invention.

Here, the second interlayer insulating layer 607 preferably comprises a SiOC layer having a low dielectric constant and a high etching selectivity to the hard mask layer 608 and the second stopper layer 606. The first interlayer insulating layer 605 preferably comprises a material having a low dielectric constant and having a high etching selectivity to the first stopper 604 layer such as a SiOC layer, a porous $SiO_2$ layer, a phosphorous silicate glass (PSG) layer, a boron phosphorous silicate glass (BPSG) layer, an undoped silicate glass (USG) layer, a fluorine-doped silicate glass (FDSG) layer, a high-density plasma (HDP) layer, a plasma-enhanced tetraethylorthosilicate (PE-TEOS) layer, or a spin-on-glass (SOG) layer. The second interlayer insulating layer 607 may be formed of a different material from the material of the first interlayer insulating layer 605. The second interlayer insulating layer 607, in FIG. 32, is preferably formed of the same material as the first interlayer insulating layer 605.

Next, a SOG layer 614 is formed on the semiconductor substrate 600 having the partial via hole 612 by spin coating. After coating the semiconductor substrate 600 with the SOG layer 614, the semiconductor substrate 600 is preferably baked at a temperature between 250° C. and 350° C. for about 30 seconds~about 5 minutes. The SOG layer 614 preferably comprises a material layer having a high wet-etching selectivity to a second interlayer insulating layer 607a such as a HSQ layer or a $SiO_2$ layer. For instance, the SOG layer such as a HSQ layer is etched very rapidly in a HF solution, whereas the second interlayer insulating layer 607a such as a SiOC layer is hardly be etched in the HF solution. For example, if a HSQ layer, a SiOC layer, and a SiC layer are wet-etched in a HF aqueous solution for 90 seconds (in which HF is diluted with water to a ratio of 1:500), the HSQ layer is etched to a thickness of 470 Å, the SiOC layer is etched to a thickness of 15–31 Å, and the SiC layer is etched to a thickness of 13 Å.

Figure 33:
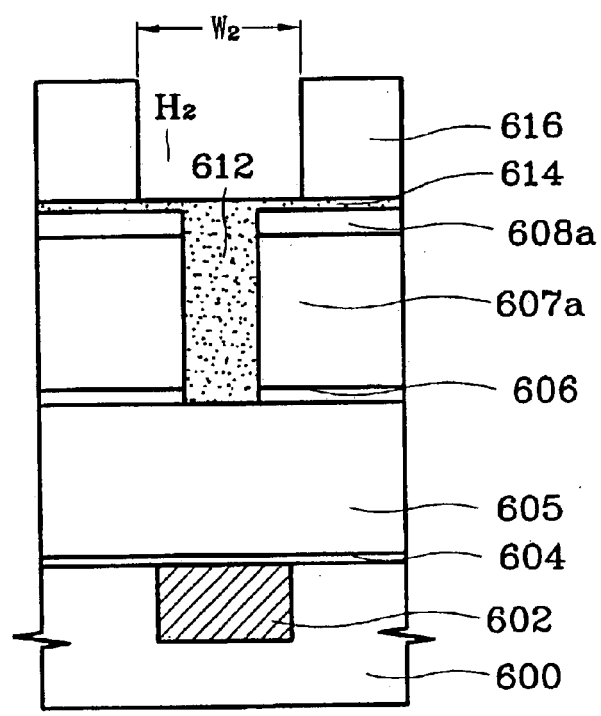

Referring to FIG. 33, a second photoresist pattern 616 is formed on the SOG layer 614. The second photoresist pattern 616 comprises a second opening $H_2$ having a second width $W_2$ greater than the first width $W_1$, and partially exposing the SOG layer 614. The second opening $H_2$ is formed to be aligned with the partial via hole 712. When the SOG layer 614 and a hard mask layer 608a are etched, the partial via hole 612 formed in the second interlayer insulating layer 607a is exposed.

Figure 34:
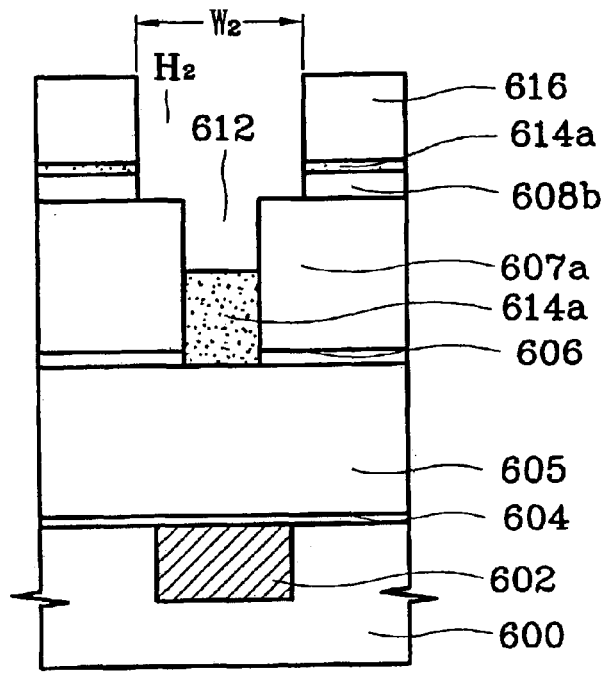

Referring to FIG. 34, the SOG layer 614 and the hard mask layer 608a on the second interlayer insulating layer 607a are dry-etched using the second photoresist pattern 616 as an etching mask. At this time, an etching gas may comprise one of a $C_xF_y$-based gas, a $C_xH_yF_z$-based gas, an inert gas, such as Ar, and a gas comprising CO, $CO_2$ or $O_2$. The dry etching is preferably performed at a pressure of about 5~50 mTorr with a power of about 1000~5000 W for about 1~2 minutes. Due to the dry etching, the SOG layer 614 filling the partial via hole 612 is recessed to a predetermined depth. The SOG layer 614 may be completely removed depending on etching conditions.

Figure 35:
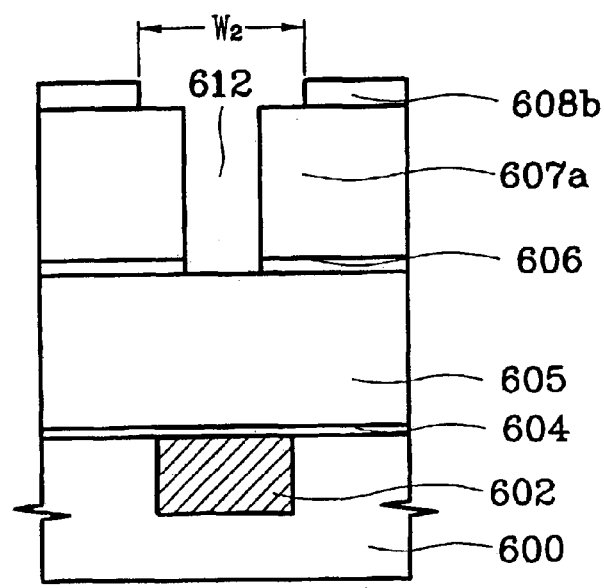

Referring to FIG. 35, the second photoresist pattern 616 is removed. The second photoresist pattern 616 may be removed by a typical method such as an ashing process.

Next, a SOG layer 614a formed on the hard mask layer 608b and in the partial via hole 612 is wet-etched and removed. At this time, an etching solution, for example, a HF solution, preferably etches the SOG layer 614a faster than the second interlayer insulating layer 607a and thus selectively removes only the SOG layer 614a. The SOG layer 614a such as a HSQ layer is etched very fast in a HF solution, whereas the interlayer insulating layer 606a such as a SiOC layer is hardly be etched in the HF solution. For example, if a HSQ layer, a SiOC layer, and a SiC layer are wet-etched in a HF aqueous solution for about 90 seconds (in which HF is diluted with water to a ratio of 1:500), the HSQ layer is etched to a thickness of 470 Å, the SiOC layer is etched to a thickness of 15–31 Å, and the SiC layer is etched to a thickness of 13 Å.

When the second photoresist pattern 616 and the SOG layer 614a are removed, the hard mask layer 608b, in which an opening having the second width $W_2$ is formed, is exposed.

Figure 36:
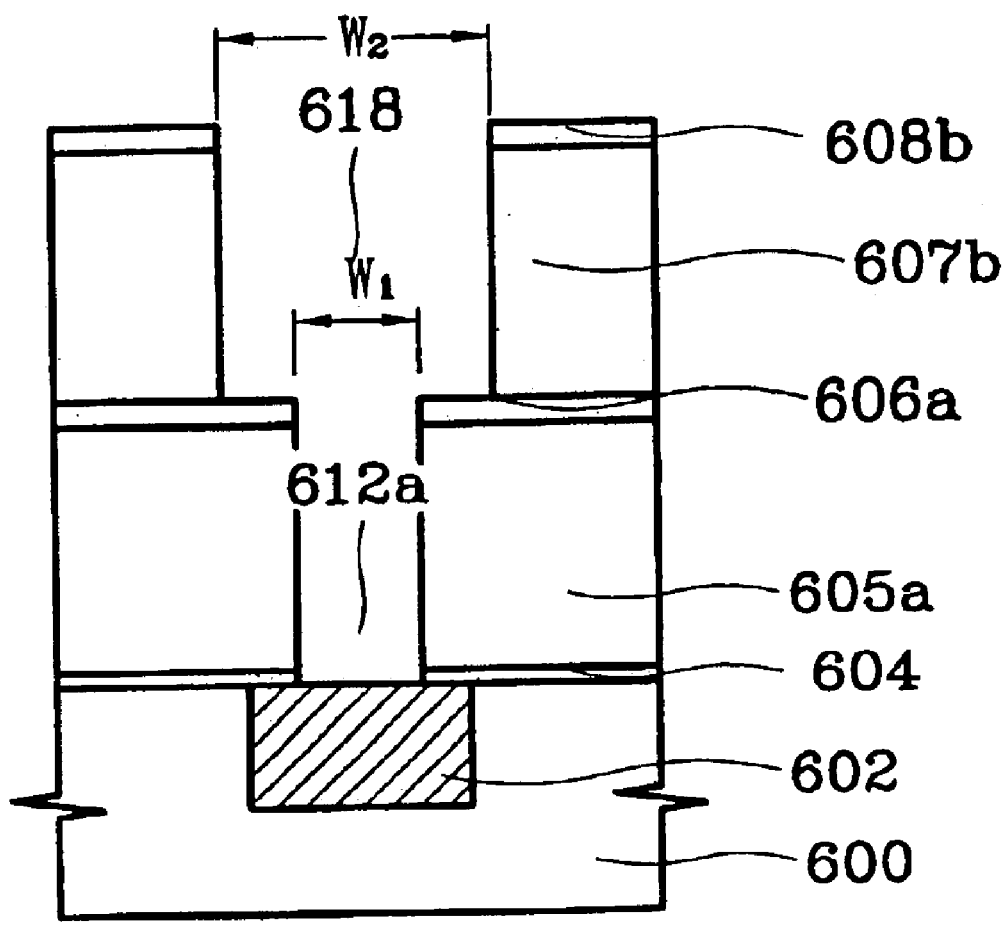

Referring to FIG. 36, the second interlayer insulating layer 607a and the first interlayer insulating layer 605 are dry-etched using the hard mask layer 608b as an etching mask, thereby simultaneously forming a wiring region 618 and a via hole 612a. In other words, the wiring region having the second width $W_2$ is formed in a second interlayer insulating layer 607b, and the via hole 612a having the first width $W_1$ less than the second width $W_2$ is formed in a first interlayer insulating layer 605a.

Next, the first stopper layer 604 exposed by the via hole 612a is etched and removed. At this time, the hard mask layer 608b may be etched and removed along with the first stopper layer 604 exposed by the via hole 612a or may be left. Subsequent processes are the same as those of the first embodiment of the present invention.

According to an embodiment of the present invention, a conductive layer is not exposed to an outside during the forming a wiring region and a via hole by etching an interlayer insulating layer (or second and first interlayer insulating layers). Thus, the embodiment of the present invention can prevent a metal oxide layer from being formed on a conductive layer during the removal of a second photoresist pattern. Further, since a partial via hole, in an embodiment of the present invention, is filled with an organic or an inorganic material before forming a second photoresist pattern, the remaining of photoresist on the bottom surface of the partial via hole can be prevented. Thus, a problem that a via hole expose a conductive layer never occurs. Furthermore, because of the filling organic or inorganic material in the partial via hole, deterioration of the profile of the via hole can be prevented even if misalignment of the second photoresist pattern. Further, since a wiring region and a via hole, in an embodiment of the present invention, are formed by an etch method using a hard mask layer as an etching mask, a surface of an interlayer insulating layer can be protected during the etching process.

Figure 37:
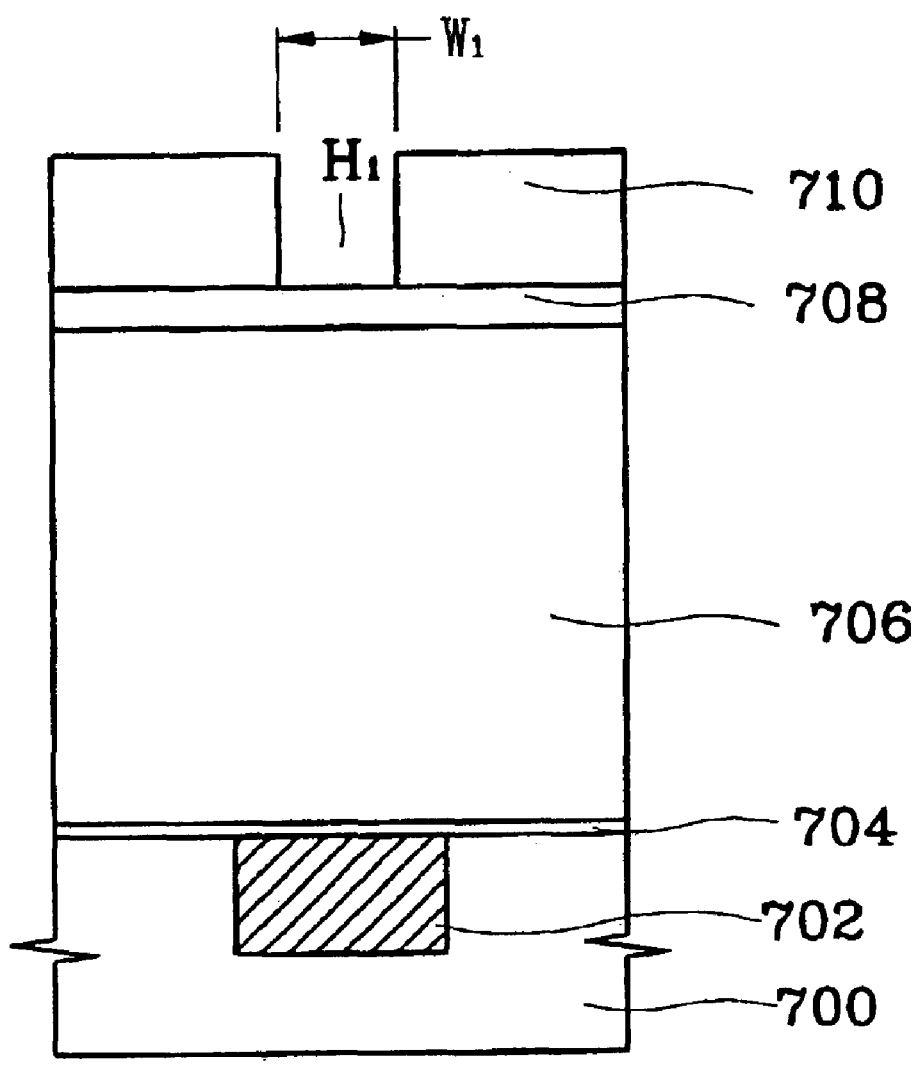
FIGS. 37 through 43 are cross-sectional views illustrating a method for forming a metal wiring layer of a semiconductor device according to a fifth embodiment of the present invention.

FIGS. 37 through 43 are cross-sectional views illustrating a method for forming a metal wiring layer of a semiconductor device according to a fifth embodiment of the present invention. Referring to FIG. 37, a stopper layer 704 is formed on a semiconductor substrate 700, on which a predetermined conductive layer 702 is formed. The conductive layer 702 may be an impurity-doped region formed on the semiconductor substrate 700, a copper (Cu) wiring layer, or other metal wiring layers. The stopper layer 704 preferably comprises a material (e.g., a silicon nitride ($Si_3N_4$) layer or a silicon carbide (SiC) layer) having a high etching selectivity with respect to an interlayer dielectric layer 706 that is formed on the stopper layer 704. The interlayer dielectric layer 706 preferably comprises a material having a high etching selectivity with respect to the stopper layer 704 and having a low dielectric constant, such as a SiOC layer, a porous $SiO_2$ layer, a PSG layer, a BPSG layer, a USG layer, an FSG layer, an HDP layer, a PE-TEOS layer, or an SOG layer.

A hard mask layer 708 is formed on the interlayer dielectric layer 706. The hard mask layer 708 preferably comprises a material having a high etching selectivity with respect to the interlayer dielectric layer 706. For example, the hard mask layer may comprise a silicon nitride layer, a silicon oxide layer, a silicon carbide layer, a polysilicon layer, a metal oxide layer such as an aluminium oxide layer, a metal nitride layer such as a TiN layer, or a metal layer such as aluminium or titanium.

A first photoresist pattern 710 is formed (on the hard mask layer 708) having a first opening H1 of width $W_1$, through which a portion of the surface of the hard mask layer 708 is exposed. The first opening H1 corresponds to the conductive layer 702 and defines a via hole, which will be described later. More specifically, the photoresist is deposited on the hard mask layer 708. Then, the photoresist is exposed to light and is developed to form the first photoresist pattern 710.

Figure 38:
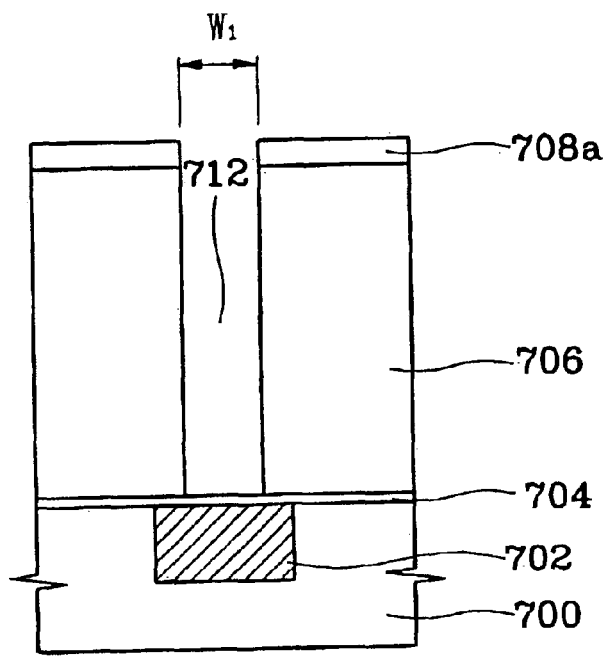

Referring to FIG. 38, a via hole 712, through which a portion of the stopper layer 704 is exposed, is formed by etching the hard mask layer 708 and the interlayer dielectric layer 706 using the first photoresist pattern 710 as an etching mask.

Thereafter, the first photoresist pattern 710 is removed using a conventional method, for example, an ashing process.

Figure 39:
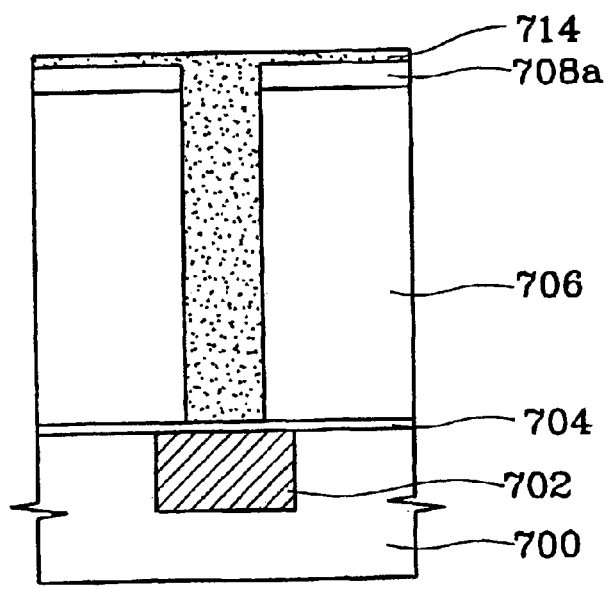

Referring to FIG. 39, the via hole 712 is filled with an intermediary material layer 714 by depositing the intermediary material layer 714 on the semiconductor substrate 700, on which the via hole 712 is formed. The intermediary material layer 714 may be formed in the via hole 712 only, or may also be formed on hard mask layer 708a to a desired thickness. The intermediary material layer 714 is preferably the same as an organic material layer described above with reference to the first and second embodiments. For example, the intermediary material layer 714 may comprise a bottom anti-reflection coating (BARC) layer, which is a carbon-based organic material layer. The BARC layer may be formed using a spin coating method, as mentioned above with reference to the first embodiment.

Alternatively, the intermediary material layer 714 may comprise an SOG layer, such as described above with reference to the third and fourth embodiments. The SOG layer is preferably an HSQ layer, which is an inorganic material layer, an MSQ layer, or a porous $SiO_2$ layer.

Figure 40:
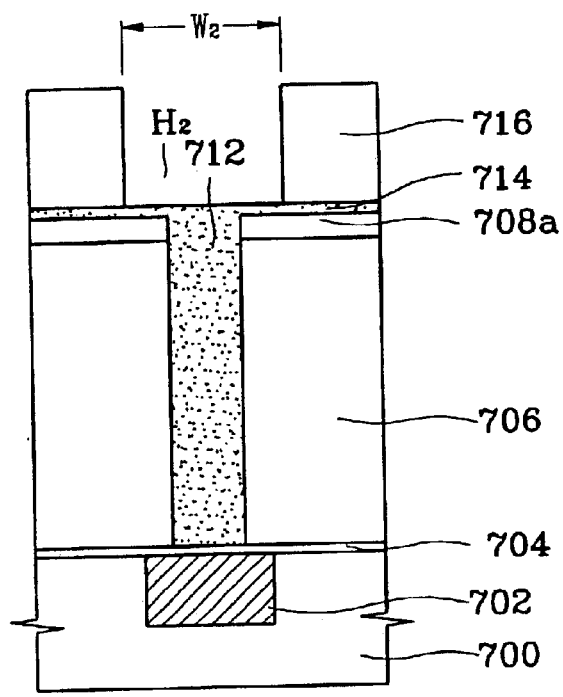

Referring to FIG. 40, a second photoresist pattern 716 is formed having a second opening H2 of width $W_2$, through which a portion of the intermediary material layer 714 is exposed. The width $W_2$ is greater than the width $W_1$. The second opening H2 is formed over the via hole 712 to correspond to the via hole 712 and to overlap at least part of the via hole 712.

Figure 41:
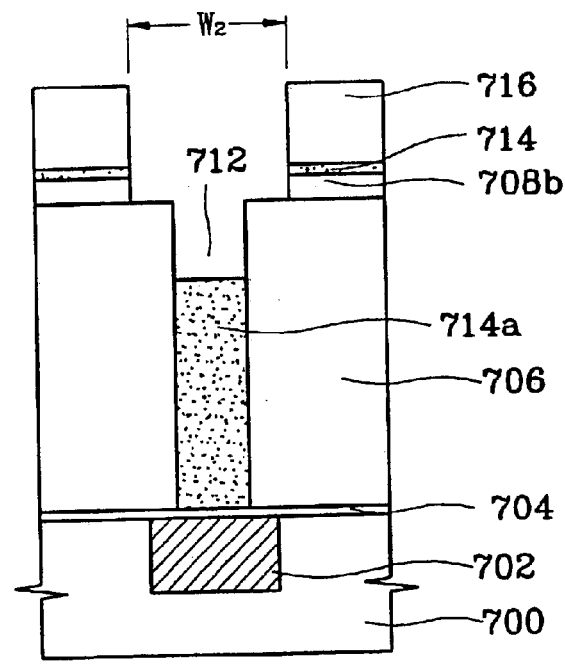

Referring to FIG. 41, the intermediary material layer 714 and the hard mask layer 708a on the interlayer dielectric layer 706 are dry-etched using the second photoresist pattern 716 as an etching mask. When the intermediary material layer 714 is a BARC layer, a gas containing O2 or containing $N_2$ and $H_2$ is preferably used as an etching gas.

Alternatively, a $C_xF_y$-based gas or a $C_xH_yF_z$-based gas, or an inert gas such as Ar, and CO or $O_2$ gas, may be used as an etching gas. During the dry etching process, the intermediary material layer 714 in the via hole 712 is slightly recessed.

When the intermediary material layer 714 is an SOG layer, a $C_xF_y$-based gas or $C_xH_yF_z$-based gas, or an inert gas such as Ar, and CO, $CO_2$ or $O_2$ gas, is preferably used as an etching gas for the drying etching process. The dry etching process is preferably performed with a power of 1,000–5,000 W under a pressure of 5–50 mTorr for 1–2 minutes.

Figure 42:
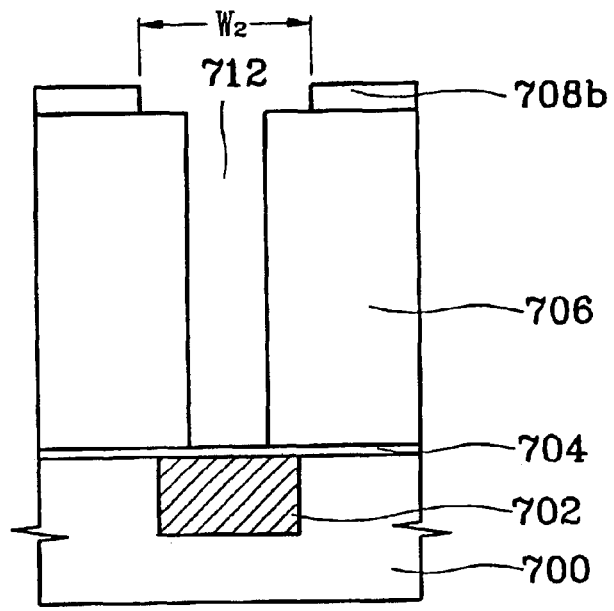

Referring to FIG. 42, the second photoresist pattern 716 is removed using a conventional method, for example, an ashing process. When removing the photoresist patter 716, if the intermediary material layer 714 comprises an organic material layer, the intermediary material layer 714 is removed along with the second photoresist pattern 716. Due to the removal of the second photoresist pattern 716 and the intermediary material layer 714, a hard mask layer 708b, which has an opening having a second width $W_2$, is exposed.

When the intermediary material layer 714 is an SOG layer, the intermediary material layer 714 that is formed on the hard mask layer 708b, as well as the intermediary material layer 714 in the via hole 712, is removed using wet etching. In the wet etching process, an etchant such as an HF solution is preferably used, which is capable of etching an SOG layer very fast and thus selectively removing the SOG layer. Indeed, while an SOG layer, such as an HSQ layer, can be etched very fast in an HF solution, the interlayer dielectric layer 706, for example, an SiOC layer is etched at a very slow rate in the HF solution.

Figure 43:
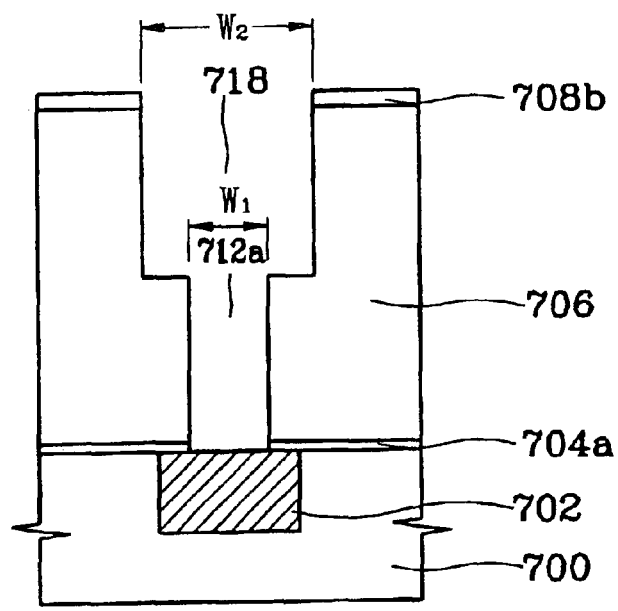

Referring to FIG. 43, the interlayer dielectric layer 706 is dry-etched using the hard mask layer 708b as an etching mask, thus forming a wiring region 718 and a via hole 712a at the same time. In other words, the wiring region 718 is formed in the interlayer dielectric layer 706 to have the second width $W_2$, and the via hole 712a is formed below the wiring region 718 to have the first width $W_1$, which is smaller than the second width $W_2$. The hard mask layer 708b, which is used as an etching mask in the process of etching the interlayer dielectric layer should have a sufficient thickness to endure the etching process.

Thereafter, the portion of the stopper layer 704 that is exposed through the via hole 712a is etched away. At this time, the hard mask layer 708b may also be etched away along with the stopper layer 704, or the hard mask layer 708b may be left.

Next, a barrier layer (not shown) and a conductive layer (not shown) are filled into the wiring region 718 and the via hole 712a, from which the stopper layer 704 has been removed, and are planarized, thus completing formation of a metal wiring layer having a dual damascene structure that is the same as in the first embodiment.

FIGS. 44 through 50 are cross-sectional views illustrating a method of forming a metal wiring layer of a semiconductor device according to a sixth embodiment of the present invention. The sixth embodiment is the same as the aforementioned fifth embodiment except that a first interlayer dielectric layer 805, a second stopper layer 806, and a second interlayer dielectric layer 807 are formed instead of the interlayer dielectric layer 706 as in the fifth embodiment described above.

Figure 44:
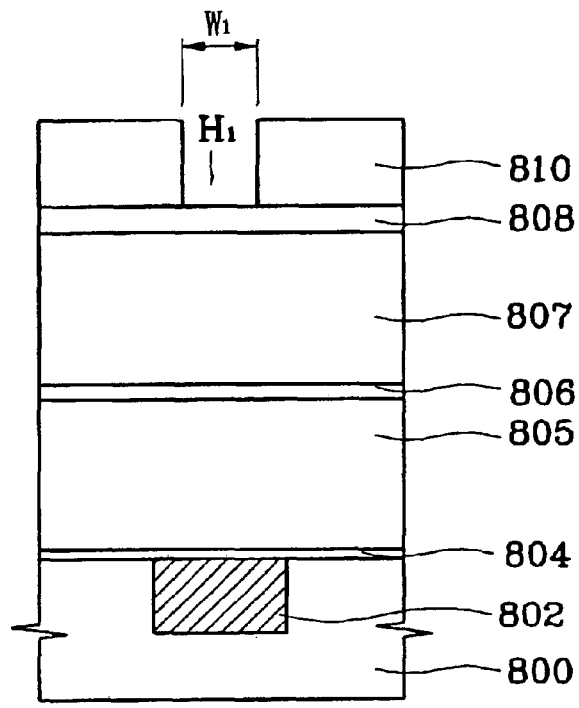
FIGS. 44 through 50 are cross-sectional views illustrating a method for forming a metal wiring layer of a semiconductor device according to a sixth embodiment of the present invention.

Referring to FIG. 44, a first stopper layer 804 is formed on a semiconductor substrate 800, on which a predetermined conductive layer 802 is formed. Next, the first interlayer dielectric layer 805, the second stopper layer 806, and the second interlayer dielectric layer 807 are sequentially formed on the first stopper layer 804.

Thereafter, a hard mask layer 808 is formed on the second interlayer dielectric layer 807. The hard mask layer 808 preferably comprises a material having a high etching selectivity with respect to the second interlayer dielectric layer 807. For example, the hard mask layer 808 may comprise a silicon nitride layer, a silicon oxide layer, a silicon carbide layer, a polysilicon layer, a metal oxide layer such as aluminium oxide, a metal nitride layer such as TiN, or a metal layer such as aluminium or titanium.

Next, a first photoresist pattern 810 is formed having a first opening H1 of width $W_1$, through which a portion of the top surface of the hard mask layer 808 is exposed. The first opening H1 corresponds to the conductive layer 802 and defines a via hole, which will be described later.

Figure 45:
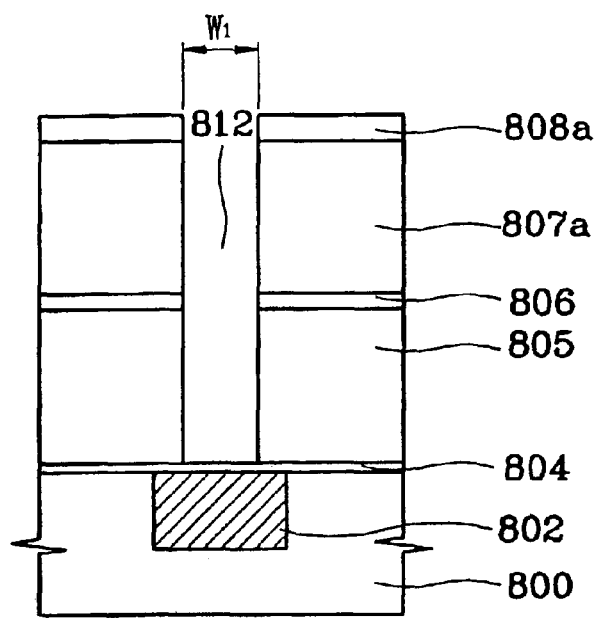

Referring to FIG. 45, the hard mask layer 808, a second interlayer dielectric layer 807a, the second stopper layer 806, and the first interlayer dielectric layer 806 are sequentially etched using the first photoresist pattern 810 as an etching mask while changing etching conditions, thus forming a via hole 812, through which a portion of the stopper layer 804 is exposed. Next, the first photoresist pattern 810 is removed.

Figure 46:
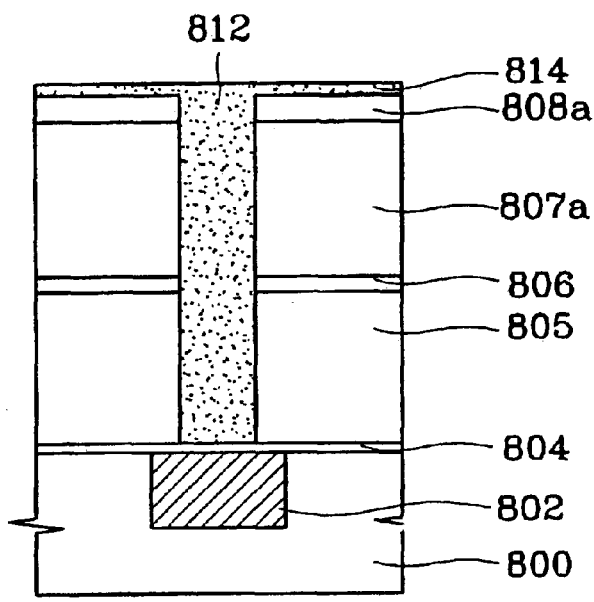

Referring to FIG. 46, an intermediary material layer 814 is formed to fill the via hole 812. The intermediary material layer 814 may be formed in the via hole 812 only, or the intermediary material layer 814 may also be thinly formed on a hard mask layer 808a at a predetermined height. The intermediary material layer 814 is the same as described above with reference to the fifth embodiment. Specifically, the intermediary material layer 814 may comprise a BARC layer, which is a carbon-based organic material layer, or an SOG layer.

Figure 47:
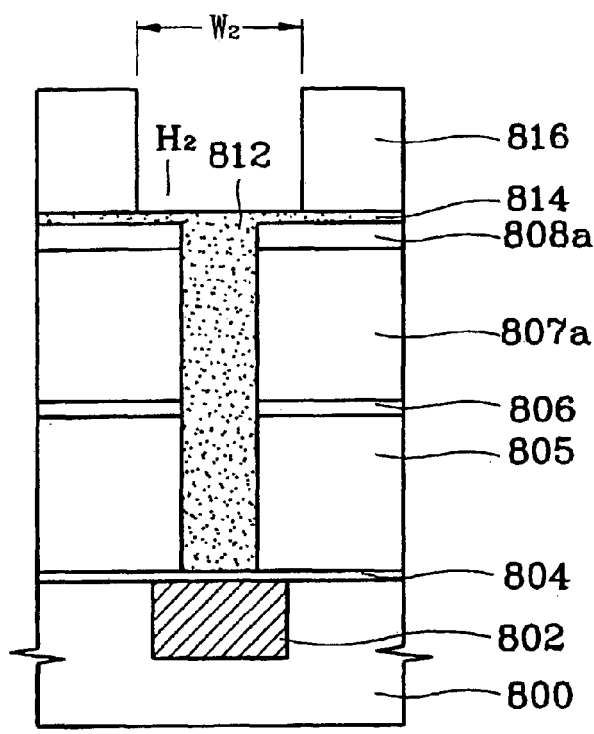

Referring to FIG. 47, a second photoresist pattern 816 is formed having a second opening H2 of width $W_2$, through which a portion of the intermediary material layer 814 is exposed. The width $W_2$ is greater than the width $W_1$. The second opening H2 is formed over the via hole 712 to correspond to the via hole 712 and to overlap at least part of the via hole 712, to form a dual damascene structure.

Figure 48:
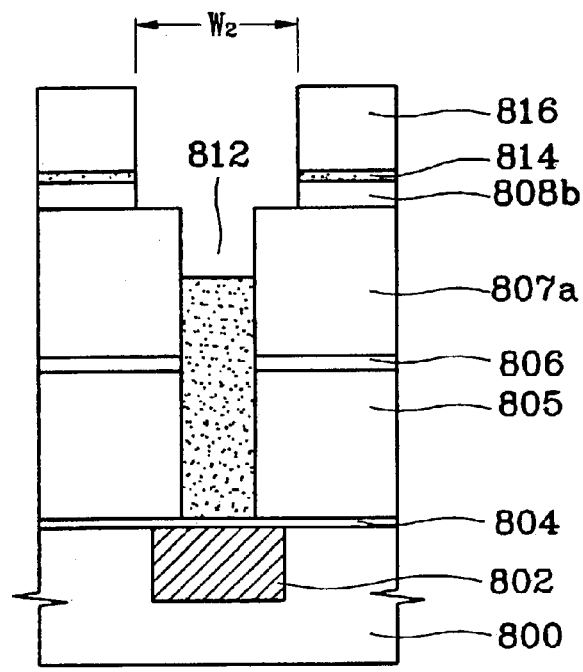

Referring to FIG. 48, the intermediary material layer 814 and a hard mask layer 808b are dry-etched using the second photoresist pattern 816 as an etching mask. During the dry etching process, the intermediary material layer 814 in the via hole 812 is also slightly recessed.

Figure 49:
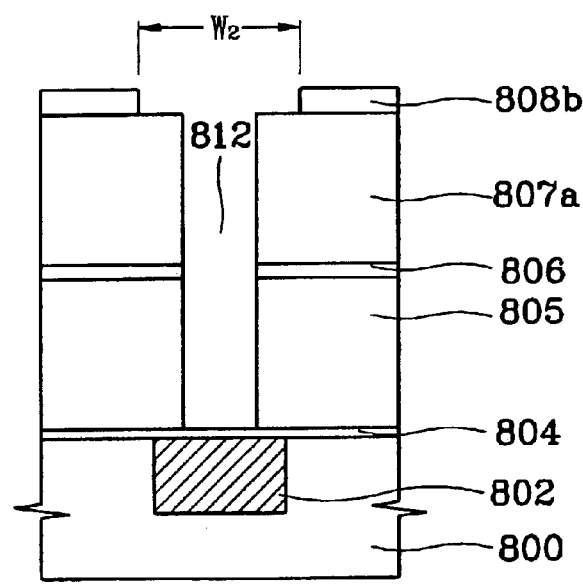

Referring to FIG. 49, the second photoresist pattern 816 is removed using a conventional method, for example, an ashing process. Thereafter, as in the fifth embodiment described above, the intermediary material layer 814 remaining in the via hole 812 is removed.

Figure 50:
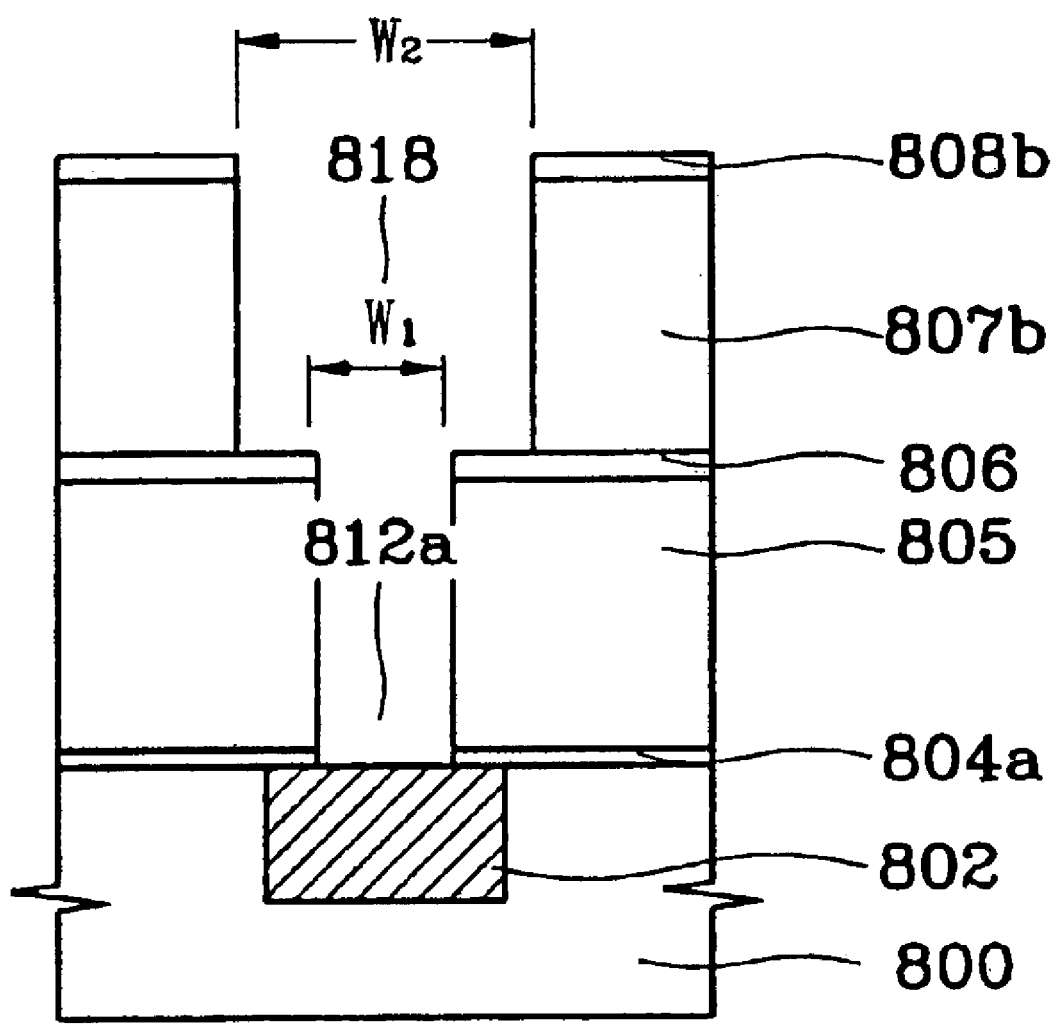

Referring to FIG. 50, a second interlayer dielectric layer 807b is dry-etched using the hard mask layer 808b as an etching mask until the second stopper layer 806 is exposed, thereby forming a wiring region 818. Next, a portion of the first stopper layer 804 exposed through a via hole 812a is etched away to form layer 804a. During the process of etching the first stopper layer 804, the hard mask layer 808b may also be etched away, or the hard mask layer 808b may be left.

Next, a barrier layer (not shown) and a conductive layer (not shown) are filled into the wiring region 818 and the via hole 812a, from which the stopper layer 704 has been removed, and are planarized, thus completing formation of a metal wiring layer having a dual damascene structure, which is the same as in the first embodiment.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a wiring layer in a semiconductor device, comprising the steps of:
   forming a stopper layer on a semiconductor substrate that has a conductive layer formed thereon;
   forming an interlayer dielectric layer on the stopper layer;
   forming a hard mask layer on the interlayer dielectric layer;
   forming a first photoresist pattern on the hard mask layer, the first photoresist pattern having a first opening corresponding to the conductive layer;
   etching the hard mask layer and the interlayer dielectric layer using the first photoresist pattern as an etching mask, to form a via hole in the interlayer dielectric layer, through which a portion of the stopper layer is exposed;
   removing the first photoresist pattern;
   filling the via hole with an intermediary material layer, wherein the intermediary material layer comprises a BARC layer or an SOG layer. and wherein the intermediary material layer has an etching selectivity with respect to the interlayer dielectric layer;
   etching a portion of the hard mask layer to form a hard mask pattern that defines a wiring region, wherein the hard mask pattern comprises a second opening that overlaps the entire via hole or at least a portion of the via hole, wherein etching a portion of the hard mask layer to form the hard mask pattern comprises forming a second photoresist pattern on the semiconductor substrate, wherein the second photoresist pattern comprises an opening that corresponds to the second opening in the hard mask pattern, etching the intermediary material layer and the hard mask layer using the second photoresist pattern as an etching mask to form the hard mask pattern having the second opening, and removing the second photoresist pattern;
   removing the intermediary material layer from the via hole;
   after completely removing the second photoresist pattern and the intermediary material layer, forming the wiring region by etching a portion of the interlayer dielectric layer using the hard mask pattern as an etching mask;
   removing a portion of the stopper layer exposed by the via hole; and
   filling the via hole and the wiring region with a conductive material.

2. The method of claim 1, wherein the interlayer dielectric layer comprises a stacked layer having a first interlayer dielectric layer, a second stopper layer, and a second interlayer dielectric layer.

3. The method of claim 2, wherein the step of forming the wiring region comprises the step of etching the second interlayer dielectric layer using the second stopper layer as an etching stopper to form the wiring region.

4. The method of claim 3, wherein the stopper layers comprise a silicon nitride layer or a silicon carbide layer, which has an etching selectivity with respect to the interlayer dielectric layers.

5. The method of claim 1, wherein the stopper layer comprises a silicon nitride layer or a silicon carbide layer, which has an etching selectivity with respect to the interlayer dielectric layer.

6. The method of claim 1, wherein the interlayer dielectric layer comprises a SiOC layer, a porous SiO2 layer, a PSG layer, a BPSG layer, a USG layer, an FSG layer, an HDP layer, a PE-TEOS layer or an SOG layer.

7. The method of claim 1, wherein the hard mask layer comprises one of a silicon oxide layer, a silicon nitride layer, a silicon carbide layer, a polysilicon layer, a metal oxide layer, a metal nitride layer, and a metal layer, and wherein the hard mask layer has a high etching selectivity with respect to the interlayer dielectric layer.

8. The method of claim 1, wherein the SOG layer comprises an HSQ layer, an MSQ layer, or a porous SiO2 layer, which is an inorganic material layer having an etching selectivity with respect to the interlayer dielectric layer.

9. The method of claim 1, wherein the step of filling the via hole with the intermediary material layer comprises forming the intermediary material layer on the hard mask layer to a predetermined height.

10. The method of claim 1, wherein the steps of removing the second photoresist pattern and removing the intermediary material layer are performed simultaneously.

11. A method for forming a wiring layer in a semiconductor device, comprising the steps of:
   forming a first stopper layer on a semiconductor substrate that has a conductive layer formed thereon;
   forming a first interlayer dielectric layer on the first stopper layer;
   forming a second stopper layer on the first interlayer dielectric layer;
   forming a second interlayer dielectric layer on the second stopper layer;
   forming a hard mask layer on the second interlayer dielectric layer;
   forming a first photoresist pattern on the hard mask layer, the first photoresist pattern having a first opening corresponding to the conductive layer;
   etching the hard mask layer, the second interlayer dielectric layer, the second stopper layer, and the first interlayer dielectric layer to form a via hole in the second interlayer dielectric layer, the second stopper layer and the first interlayer dielectric layer using the first photoresist pattern as an etching mask and the first stopper layer as an etch stop;
   removing the first photoresist pattern;
   filling the via hole with an intermediary material layer, wherein the intermediary material layer comprises a BARC layer or an SOG layer, and wherein the intermediary material layer has an etching selectivity with respect to the interlayer dielectric layer;
   etching a portion of the hard mask layer using a second photoresist pattern to form a hard mask pattern that defines a wiring region, wherein the hard mask pattern comprises a second opening that overlaps the entire via hole or at least a portion of the via hole;
   removing the second photoresist pattern and removing the intermediary material layer from the via hole;
   after completely removing the second photoresist pattern and the intermediary material layer, forming the wiring region by etching a portion of the second interlayer dielectric down to the second stopper layer using the hard mask pattern as an etching mask;
   removing a portion of the first stopper layer exposed by the via hole; and filling the via hole and the wiring region with a conductive material.

12. The method of claim 11, wherein the SOG layer comprises an HSQ layer, an MSQ layer, or a porous $SiO_2$ layer, which is an inorganic material layer having an etching selectivity with respect to the interlayer dielectric layer.

13. The method of claim 11, wherein the steps removing the second photoresist pattern and removing the intermediary material layer are performed simultaneously.

14. A method for forming a wiring layer in a semiconductor device, comprising the steps of:

forming a stopper layer on a semiconductor substrate that has a conductive layer formed thereon;

forming an interlayer dielectric layer on the stopper layer;

forming a hard mask layer on the interlayer dielectric layer;

forming a first photoresist pattern on the hard mask layer, the first photoresist pattern having a first opening corresponding to the conductive layer;

etching the hard mask layer and the interlayer dielectric layer using the first photoresist pattern as an etching mask, to form a via hole in the interlayer dielectric layer, through which a portion of the stopper layer is exposed;

removing the first photoresist pattern;

filling the via hole with an intermediary material layer;

forming a second photoresist pattern on the semiconductor substrate;

etching a portion of the hard mask layer using the second photoresist pattern to form a hard mask pattern that defines a wiring region, wherein the hard mask pattern comprises a second opening that overlaps the entire via hole or at least a portion of the via hole;

removing the second photoresist pattern and removing the intermediary material layer, from the via hole;

after completely removing the second photoresist pattern and the intermediary material layer, forming the wiring region by etching a portion of the interlayer dielectric layer using the hard mask pattern as an etching mask;

removing a portion of the stopper layer exposed by the via hole; and filling the via hole and the wiring region with a conductive material.

15. The method of claim 14, wherein the steps of removing the second photoresist pattern and removing the intermediary material layer are performed simultaneously.

16. The method of claim 14, wherein the intermediary material layer comprises a BARC layer or an SOG layer, and wherein the intermediary material layer has an etching selectivity with respect to the first and second interlayer dielectric layers.

17. The method of claim 16, wherein the SOG layer comprises an HSQ layer, an MSQ layer, or a porous SiC2 layer, which is an inorganic material layer having an etching selectivity with respect to the interlayer dielectric layer.

* * * * *